US012730241B2

(12) United States Patent
Kristiansen et al.

(10) Patent No.: US 12,730,241 B2
(45) Date of Patent: Sep. 8, 2026

(54) DIRECT ARRIVAL REPLACEMENT FOR SEISMIC IMAGING

(71) Applicant: Schlumberger Technology Corporation, Sugar Land, TX (US)

(72) Inventors: Paal Kristiansen, Oslo (NO); Philippe Caprioli, Chelmsford (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 394 days.

(21) Appl. No.: 18/575,601

(22) PCT Filed: Jun. 30, 2022

(86) PCT No.: PCT/US2022/035780
§ 371 (c)(1),
(2) Date: Dec. 29, 2023

(87) PCT Pub. No.: WO2023/278738
PCT Pub. Date: Jan. 5, 2023

(65) Prior Publication Data

US 2026/0140273 A1 May 21, 2026

Related U.S. Application Data

(60) Provisional application No. 63/202,952, filed on Jul. 1, 2021.

(51) Int. Cl.
*G01V 1/32* (2006.01)
*G01V 1/28* (2006.01)
(Continued)

(52) U.S. Cl.
CPC ................ *G01V 1/32* (2013.01); *G01V 1/282* (2013.01); *G01V 1/36* (2013.01); *G06F 30/23* (2020.01);
(Continued)

(58) Field of Classification Search
CPC ... G01V 1/32; G01V 1/28; G01V 1/00; G01V 1/282; G01V 1/36; G01V 2210/32;
(Continued)

(56) References Cited

U.S. PATENT DOCUMENTS

2009/0097356 A1 4/2009 Haldorsen
2016/0187513 A1* 6/2016 Poole .................... G01V 1/362 702/16

(Continued)

OTHER PUBLICATIONS

Majdanski et al., "Attenuation of free-surface multiples by up/down deconvolution for marine towed-streamer data", Dec. 2011, Geophysics, vol. 76, pp. V129-V138. (Year: 2011).*

(Continued)

*Primary Examiner* — Mohamed Charioui
(74) *Attorney, Agent, or Firm* — Kyle R. Miiller

(57) ABSTRACT

Computing systems, computer-readable media, and methods for direct arrival replacement. The method includes creating intermediate data from an acquired data by attenuating a direct arrival signal or attenuating the direct arrival signal and one or more strong early arrival signals recorded at a receiver; transforming the temporary data from a first processing domain into a second processing domain; modelling the direct arrival signal in the second processing domain; estimating a scalar for model calibration and a seabed reflectivity from an area around the direct arrival signal; and inserting the direct arrival signal that is modelled into the intermediate data in the second processing domain.

19 Claims, 25 Drawing Sheets

(51) Int. Cl.
*G01V 1/36* (2006.01)
*G06F 30/23* (2020.01)

(52) U.S. Cl.
CPC ...... *G01V 2210/32* (2013.01); *G01V 2210/46* (2013.01)

(58) Field of Classification Search
CPC ..... G01V 2210/46; G06F 30/23; G06F 30/20; G06F 30/00
See application file for complete search history.

(56) References Cited

U.S. PATENT DOCUMENTS

| | | | | |
|---|---|---|---|---|
| 2017/0269246 | A1* | 9/2017 | Anderson | G01V 1/366 |
| 2019/0293820 | A1* | 9/2019 | Nguyen | G01V 1/36 |
| 2020/0124755 | A1* | 4/2020 | Söllner | G01V 1/362 |
| 2020/0292724 | A1* | 9/2020 | Boiero | G01V 1/306 |

OTHER PUBLICATIONS

Dessa, J.-X., et al., Combined Traveltime and Frequency-Domain Seismic Waveform Inversion: ACase Study on Multi-Offset Ultrasonic Data, Geophysical Journal International, Jul. 2003, 154, No. 1, pp. 117-133.

Bale, R., Plane Wave Deghosting of Hydrophone and Geophone OBC Data, SEG Technical Program Expanded Abstracts, 1998.

"Majdanski, M. et al., ""Attenuation of free-surface multiples by up/down deconvolution for marine towed-streamer data"", Society of Exploration Geophysicists, 76, No. 6, Nov. 2011, pp. V129-V138."

Ziolkowski, A., et al. "The Signature of an Air-Gun Array—Computation From Near-field Measurements Including Interactions", Geophysics, 1982, pp. 1413-1421, vol. 47, Issue 10.

Wang, X., et al., Noise Suppressing and Direct Wave Arrivals Removal in GPR Data Based on Shearlet Transform, Signal Processing, Mar. 1, 2017, pp. 227-242, vol. 132.

* cited by examiner

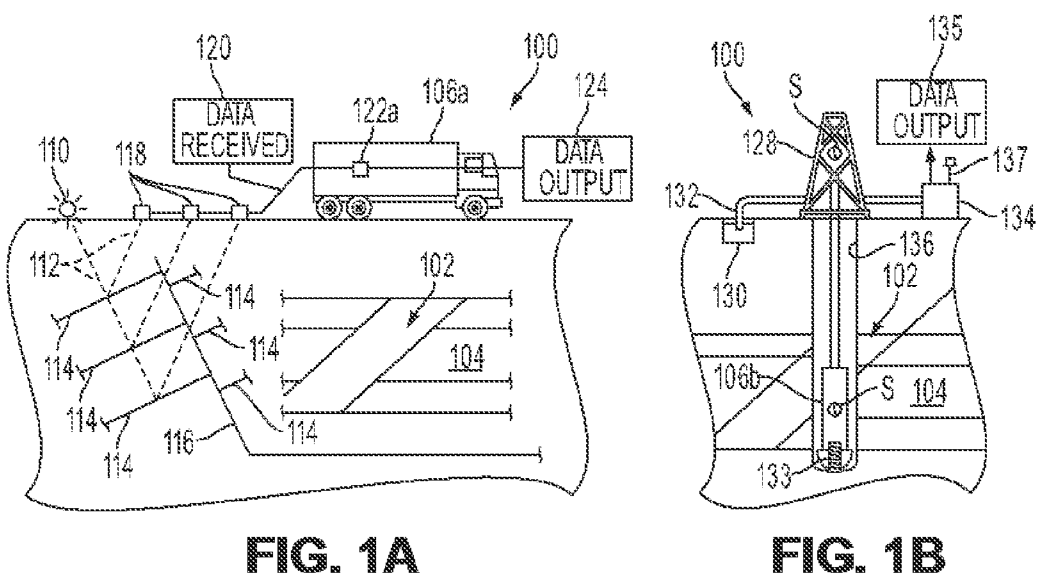
FIG. 1A
FIG. 1B
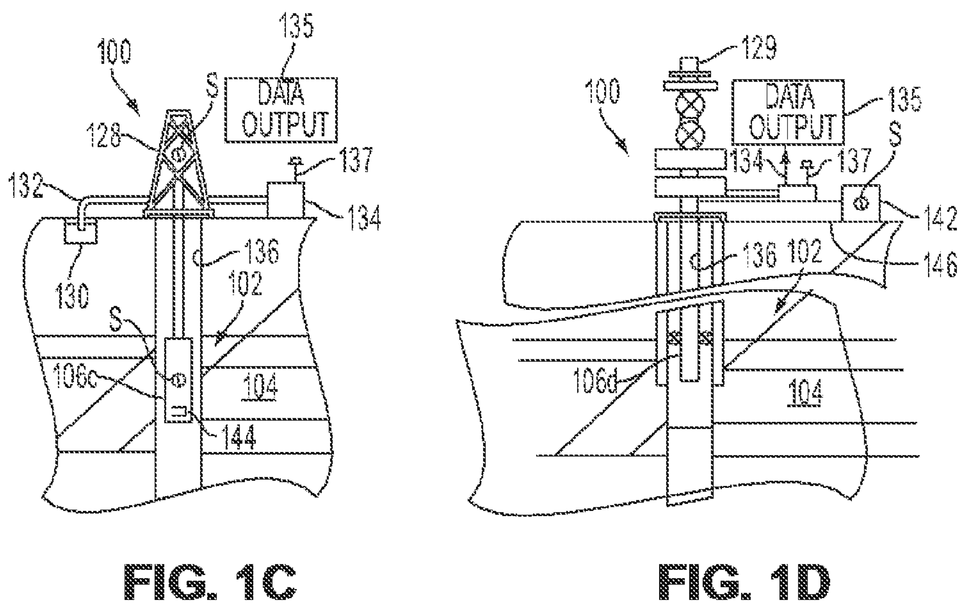
FIG. 1C
FIG. 1D

DIRECT ARRIVAL REPLACEMENT FOR SEISMIC IMAGING

CROSS-REFERENCE TO RELATED APPLICATIONS

This application is a National Stage Entry of International Application No. PCT/US2022/035780, filed Jun. 30, 2022, which claims priority to U.S. Provisional Application No. 63/202,952, which was filed on Jul. 1, 2021 and is incorporated herein by reference in its entirety.

BACKGROUND

Ocean Bottom Seismic (OBS) data acquisition is an approach in which seismometers are placed at the ocean bottom and shots are fired at the ocean surface. OBS data acquisition can be done with either ocean bottom cables (OBC) or with nodes (OBN). The OBS method uses geophones and hydrophones and record both compressional and shear waves. The combination of the data recorded by this set of sensors permits separating up-and down-going waves at the seabed and therefore provides good opportunities for imaging with multiples. For ocean bottom data acquisition, down-going events include direct arrival, receiver ghosts, and higher-order pegleg multiples. On the other hand, up-going events include primaries, and pegleg multiples.

One of the methods for near-surface model building is the analysis of seismic refraction data. This method conventionally requires picking of direct-and head-wave arrivals on many shot records. Picking techniques can be divided into manual and automatic. Manual picking techniques are usually time consuming, while automatic techniques, such as cross-correlation, are occasionally inaccurate and may require preparation of the data. In particular, direct arrivals are usually difficult to pick beyond the crossover distance because of interference with other arrivals, rendering only few if any near-offset traces useful for direct-arrival picking. In OBS, the direct arrival may not be used in the imaging of the subsurface, but may be the strongest event in the recorded data. Further, the direct arrival may not contain imaging information.

SUMMARY

According to examples of the present teachings, a method for direct arrival replacement is disclosed. The method includes creating intermediate data from an acquired data by attenuating a direct arrival signal or attenuating the direct arrival signal and one or more strong early arrival signals recorded at a receiver, transforming the intermediate data from a first processing domain into a second processing domain, modelling the direct arrival signal in the second processing domain, estimating a scalar for model calibration and a seabed reflectivity from an area around the direct arrival signal, and inserting the direct arrival signal that is modelled into the intermediate data in the second processing domain.

Various additional features can be included in the method including one or more of the following features. The first processing domain comprises a space-time domain. The second processing domain comprises a Radon domain. The direct arrival signal is modeled using a calibrated marine source model or a finite difference model. The method can further include performing preprocessing of the direct arrival signal to reduce noise and/or clipping artifacts recorded by the receiver. The preprocessing includes performing a wavefield deconvolution of the direct arrival signal in a plane wave domain.

According to examples of the present teachings, a system for direct arrival replacement is disclosed. The system includes a computer processor; and a memory storing instructions executed by the computer processor, wherein the instructions comprise a method including: creating intermediate data from an acquired data by attenuating a direct arrival signal or attenuating the direct arrival signal and one or more strong early arrival signals recorded at a receiver; transforming the intermediate data from a first processing domain into a second processing domain; modelling the direct arrival signal in the second processing domain; estimating a scalar for model calibration and a seabed reflectivity from an area around the direct arrival signal; and inserting the direct arrival signal that is modelled into the intermediate data in the second processing domain.

Various additional features can be included in the system including one or more of the following features. The first processing domain comprises a space-time domain. The second processing domain comprises a Radon domain. The direct arrival signal is modeled using a calibrated marine source model or a finite difference model. The system can further include performing preprocessing of the direct arrival signal to reduce noise and/or clipping artifacts recorded by the receiver. The preprocessing includes performing a wavefield deconvolution of the direct arrival signal in a plane wave domain.

According to examples of the present teachings, a non-transitory computer readable medium storing instructions that are configured to, when executed, cause a computer processor to perform a method including: creating intermediate data from an acquired data by attenuating a direct arrival signal or attenuating the direct arrival signal and one or more strong early arrival signals recorded at a receiver; transforming the intermediate data from a first processing domain into a second processing domain; modelling the direct arrival signal in the second processing domain; estimating a scalar for model calibration and a seabed reflectivity from an area around the direct arrival signal; and inserting the direct arrival signal that is modelled into the intermediate data in the second processing domain.

Various additional features can be included in the non-transitory computer readable medium including one or more of the following features. The first processing domain comprises a space-time domain. The second processing domain comprises a Radon domain. The direct arrival signal is modeled using a calibrated marine source model or a finite difference model. The non-transitory computer readable medium can further include performing preprocessing of the direct arrival signal to reduce noise and/or clipping artifacts recorded by the receiver. The preprocessing includes performing a wavefield deconvolution of the direct arrival signal in a plane wave domain.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIGS. 1A, 1B, 1C, 1D, 2, 3A, and 3B illustrate simplified, schematic views of an oilfield and its operation, according to an embodiment.

FIG. 10C shows the difference scaled by a factor of 2.

DESCRIPTION OF EMBODIMENTS

Figure 2:
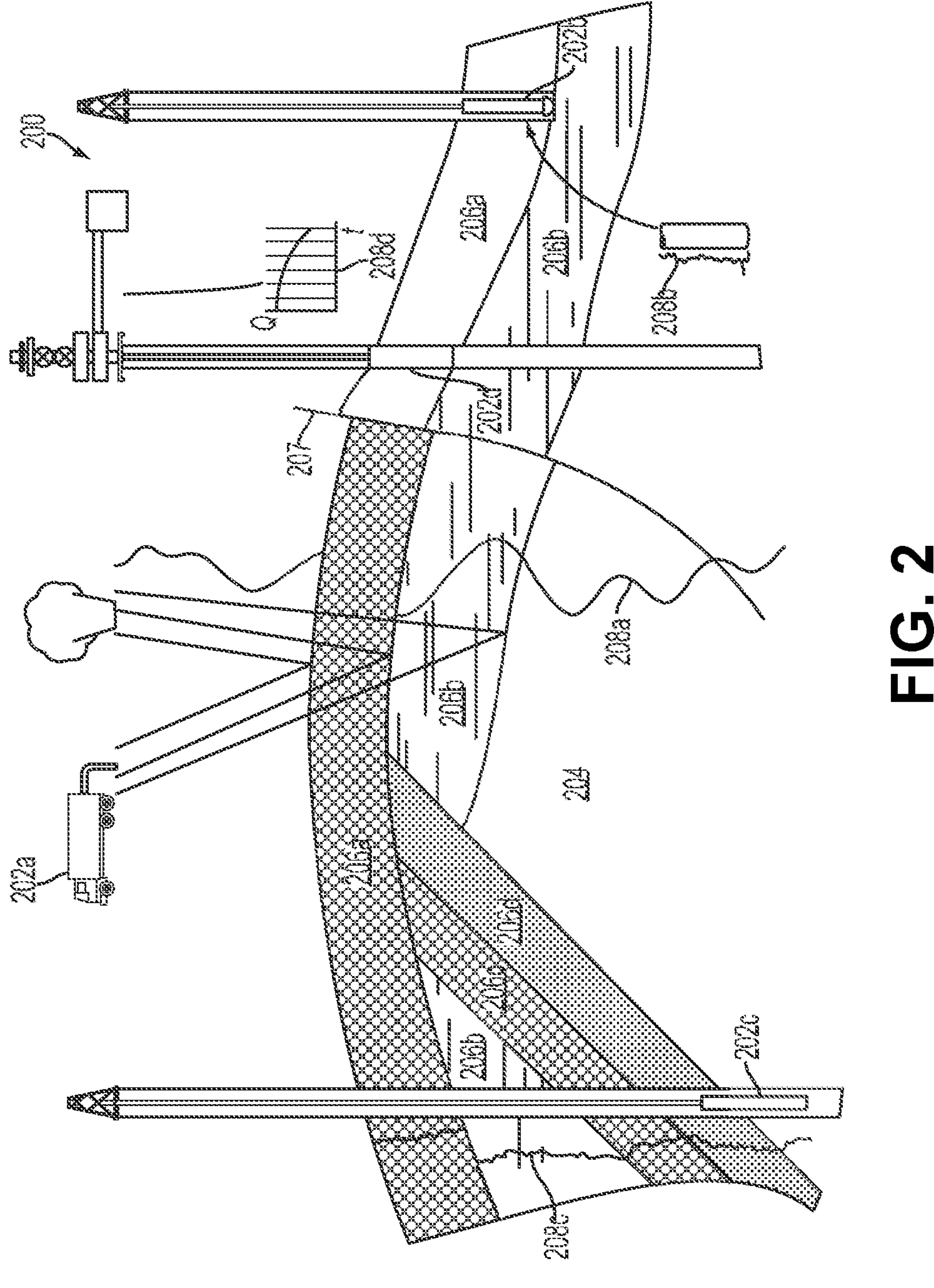

In some embodiments, systems, methods, and computer-readable media of the present disclosure may apply to a direct arrival replacement technique for improved multi-component data processing.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object could be termed a second object, and, similarly, a second object could be termed a first object, without departing from the scope of the invention. The first object and the second object are both objects, respectively, but they are not to be considered the same object.

The terminology used in the description of the invention herein is for the purpose of describing particular embodiments only and is not intended to be limiting of the invention. As used in the description of the invention and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques and workflows that are in accordance with some embodiments. Some operations in the processing procedures, methods, techniques and workflows disclosed herein may be combined and/or the order of some operations may be changed.

FIGS. 1A-1D illustrate simplified, schematic views of oilfield 100 having subterranean formation 102 containing reservoir 104 therein in accordance with implementations of various technologies and techniques described herein. FIG. 1A illustrates a survey operation being performed by a survey tool, such as seismic truck 106*a*, to measure properties of the subterranean formation. The survey operation is a seismic survey operation for producing sound vibrations. In FIG. 1A, one such sound vibration, e.g., sound vibration 112 generated by source 110, reflects off horizons 114 in earth formation 116. A set of sound vibrations is received by sensors, such as geophone-receivers 118, situated on the earth's surface. The data received 120 is provided as input data to a computer 122*a* of a seismic truck 106*a*, and responsive to the input data, computer 122*a* generates seismic data output 124. This seismic data output may be stored, transmitted or further processed as desired, for example, by data reduction.

FIG. 1B illustrates a drilling operation being performed by drilling tools 106*b* suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud is typically filtered and returned to the mud pit. A circulating system may be used for storing, controlling, or filtering the flowing drilling mud. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produce data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106*b* may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Typically, the wellbore is drilled according to a drilling plan that is established prior to drilling. The drilling plan typically sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also need adjustment as new information is collected.

The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize (or improve) portions of the field operation, such as controlling drilling, weight on bit, pump rates, or other parameters. These adjustments may be made automatically based on computer protocol, and/or manually by an operator. In some cases, well plans may be adjusted to select optimum (or improved) operating conditions, or to avoid problems.

FIG. 1C illustrates a wireline operation being performed by wireline tool 106*c* suspended by rig 128 and into wellbore 136 of FIG. 1B. Wireline tool 106*c* is adapted for deployment into wellbore 136 for generating well logs, performing downhole tests and/or collecting samples. Wireline tool 106*c* may be used to provide another method and apparatus for performing a seismic survey operation. Wireline tool 106*c* may, for example, have an explosive, radioactive, electrical, or acoustic energy source 144 that sends and/or receives electrical signals to surrounding subterranean formations 102 and fluids therein.

Wireline tool 106*c* may be operatively connected to, for example, geophones 118 and a computer 122*a* of a seismic truck 106*a* of FIG. 1A. Wireline tool 106*c* may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106*c* to measure downhole parameters which relate to, for example porosity, permeability, fluid composition and/or other parameters of the field operation.

FIG. 1D illustrates a production operation being performed by production tool 106*d* deployed from a production unit or Christmas tree 129 and into completed wellbore 136 for drawing fluid from the downhole reservoirs into surface facilities 142. The fluid flows from reservoir 104 through perforations in the casing (not shown) and into production tool 106*d* in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106*d* or associated equipment, such as Christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the wellsites for selectively collecting downhole fluids from the wellsite(s).

While FIGS. 1B-1D illustrate tools used to measure properties of an oilfield, it will be appreciated that the tools may be used in connection with non-oilfield operations, such as gas fields, mines, aquifers, storage or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 1A-1D are intended to provide a brief description of an example of a field usable with oilfield application frameworks. Part of, or the entirety, of oilfield 100 may be on land, water and/or sea. Also, while a single field measured at a single location is depicted, oilfield applications may be utilized with any combination of one or more oilfields, one or more processing facilities and one or more wellsites.

FIG. 2 illustrates a schematic view, partially in cross section of oilfield 200 having data acquisition tools 202*a*, 202*b*, 202*c* and 202*d* positioned at various locations along oilfield 200 for collecting data of subterranean formation 204 in accordance with implementations of various technologies and techniques described herein. Data acquisition tools 202a-202d may be the same as data acquisition tools 106a-106d of FIGS. 1A-1D, respectively, or others not depicted. As shown, data acquisition tools 202a-202d generate data plots or measurements 208a-208d, respectively. These data plots are depicted along oilfield 200 to demonstrate the data generated by the various operations.

Data plots 208a-208c are examples of static data plots that may be generated by data acquisition tools 202a-202c, respectively; however, it should be understood that data plots 208a-208c may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208a is a seismic two-way response over a period of time. Static plot 208b is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208c is a logging trace that typically provides a resistivity or other measurement of the formation at various depths.

A production decline curve or graph 208d is a dynamic data plot of the fluid flow rate over time. The production decline curve typically provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206a-206d. As shown, this structure has several formations or layers, including a shale layer 206a, a carbonate layer 206b, a shale layer 206c and a sand layer 206d. A fault 207 extends through the shale layer 206a and the carbonate layer 206d. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, typically below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 2, may then be processed and/or evaluated. Typically, seismic data displayed in static data plot 208a from data acquisition tool 202a is used by a geophysicist to determine characteristics of the subterranean formations and features. The core data shown in static plot 208b and/or log data from well log 208c are typically used by a geologist to determine various characteristics of the subterranean formation. The production data from graph 208d is typically used by the reservoir engineer to determine fluid flow reservoir characteristics. The data analyzed by the geologist, geophysicist and the reservoir engineer may be analyzed using modeling techniques.

Figure 3A:
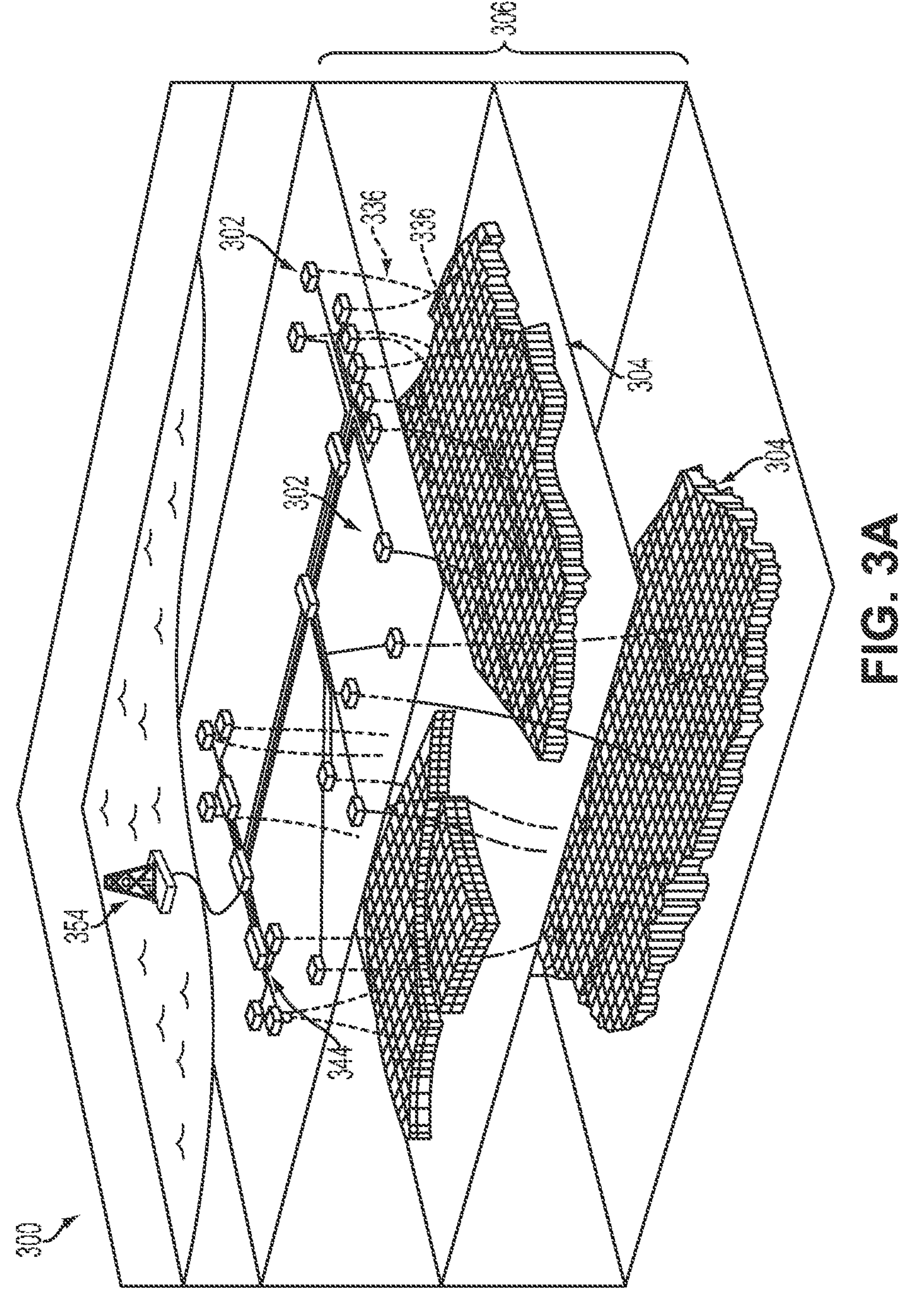

FIG. 3A illustrates an oilfield 300 for performing production operations in accordance with implementations of various technologies and techniques described herein. As shown, the oilfield has a plurality of wellsites 302 operatively connected to central processing facility 354. The oilfield configuration of FIG. 3A is not intended to limit the scope of the oilfield application system. Part, or all, of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

Figure 3B:
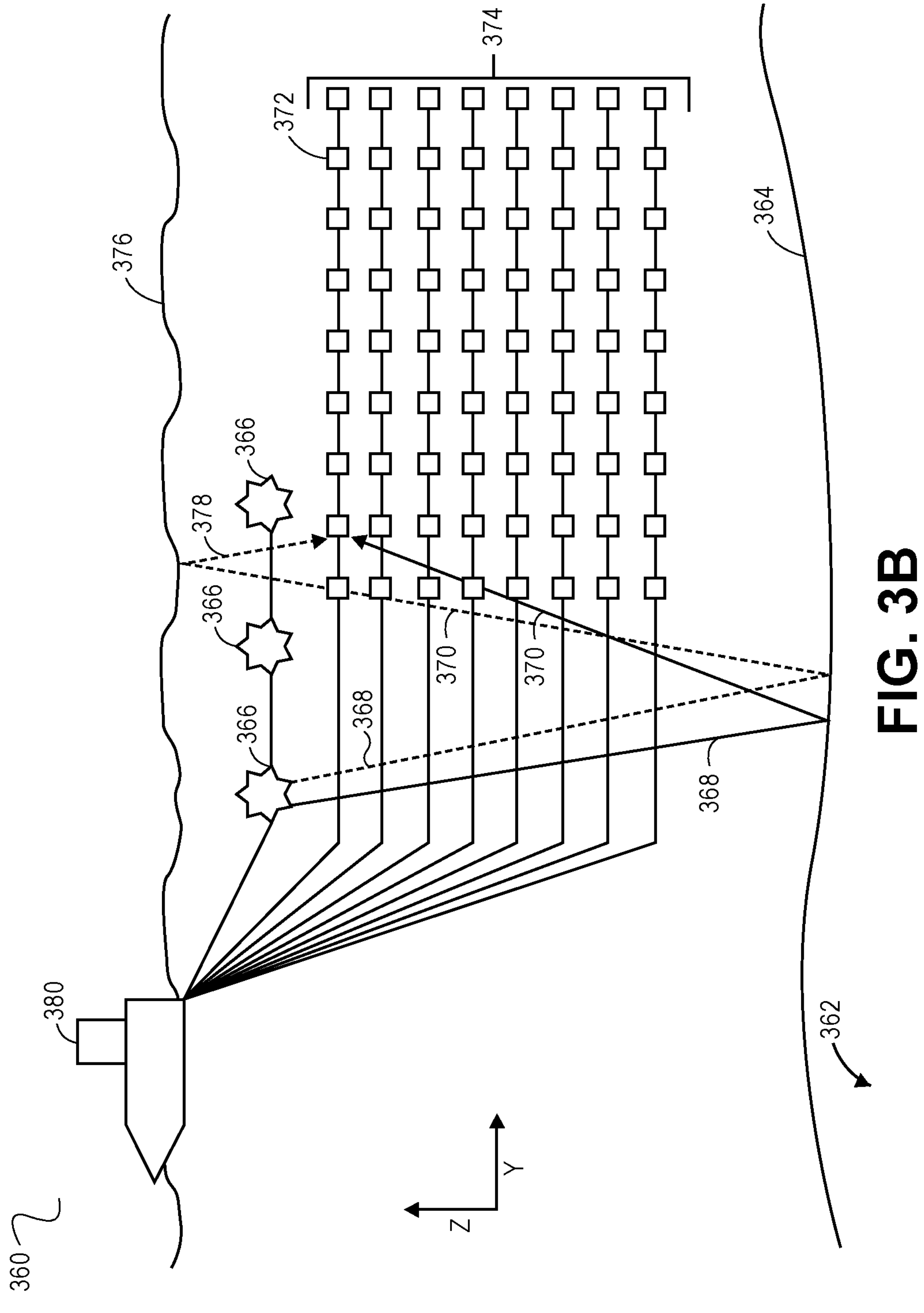

Attention is now directed to FIG. 3B, which illustrates a side view of a marine-based survey 360 of a subterranean subsurface 362 in accordance with one or more implementations of various techniques described herein. Subsurface 362 includes seafloor surface 364. Seismic sources 366 may include marine sources such as vibroseis or airguns, which may propagate seismic waves 368 (e.g., energy signals) into the Earth over an extended period of time or at a nearly instantaneous energy provided by impulsive sources. The seismic waves may be propagated by marine sources as a frequency sweep signal. For example, marine sources of the vibroseis type may initially emit a seismic wave at a low frequency (e.g., 5 Hz) and increase the seismic wave to a high frequency (e.g., 80-90 Hz) over time.

The component(s) of the seismic waves 368 may be reflected and converted by seafloor surface 364 (i.e., reflector), and seismic wave reflections 370 may be received by a plurality of seismic receivers 372. Seismic receivers 372 may be disposed on a plurality of streamers (i.e., streamer array 374). The seismic receivers 372 may generate electrical signals representative of the received seismic wave reflections 370. The electrical signals may be embedded with information regarding the subsurface 362 and captured as a record of seismic data.

In one implementation, each streamer may include streamer steering devices such as a bird, a deflector, a tail buoy and the like, which are not illustrated in this application. The streamer steering devices may be used to control the position of the streamers in accordance with the techniques described herein.

In one implementation, seismic wave reflections 370 may travel upward and reach the water/air interface at the water surface 376, a portion of reflections 370 may then reflect downward again (i.e., sea-surface ghost waves 378) and be received by the plurality of seismic receivers 372. The sea-surface ghost waves 378 may be referred to as surface multiples. The point on the water surface 376 at which the wave is reflected downward is generally referred to as the downward reflection point.

The electrical signals may be transmitted to a vessel 380 via transmission cables, wireless communication or the like. The vessel 380 may then transmit the electrical signals to a data processing center. Alternatively, the vessel 380 may include an onboard computer capable of processing the electrical signals (i.e., seismic data). Those skilled in the art having the benefit of this disclosure will appreciate that this illustration is highly idealized. For instance, surveys may be of formations deep beneath the surface. The formations may typically include multiple reflectors, some of which may include dipping events, and may generate multiple reflections (including wave conversion) for receipt by the seismic receivers 372. In one implementation, the seismic data may be processed to generate a seismic image of the subsurface 362.

Marine seismic acquisition systems tow each streamer in streamer array 374 at the same depth (e.g., 5-10 m). However, marine based survey 360 may tow each streamer in streamer array 374 at different depths such that seismic data may be acquired and processed in a manner that avoids the effects of destructive interference due to sea-surface ghost waves. For instance, marine-based survey 360 of FIG. 3B illustrates eight streamers towed by vessel 380 at eight different depths. The depth of each streamer may be controlled and maintained using the birds disposed on each streamer.

The seismic data recorded with instruments on the seabed (Ocean Bottom seismic (OBS)) includes signals which interact with the subsurface and signals which do not interact with the subsurface. Among the interacting signals, the signal reflected from the subsurface can be used to image the subsurface. Pre-imaging data processing enhances the reflected signals and reduces the noise. The reflected signals may have weak amplitudes and arrive later in the record when compared to the earliest arrivals because of their propagation within the subsurface.

Strong and early arrival signals are relative to the earliest arrival of source generated signal propagating through the water from each the seismic source to each the receiver (trace-by-trace). Also, the strong and early arrival signals tend to vary largely over the survey.

Some of the signals on the recorded data which are not used for imaging have strong amplitude (stronger than reflection signals at the same time), including the direct arrival signal. The direct arrival includes the signal that arrives directly from a transmitter (a seismic source array) to a receiver. The direct arrival propagates only in the water layer, not in the subsurface and hence does not contain any information on the subsurface. The direct arrival will have strong amplitudes when the receiver is close to the source array, e.g., small source receiver distance or offset, small water depth. Other strong signals not used for imaging can be (depending on geology, water depth, acquisition parameters, etc.) interface waves in shallow water and refractions from high velocity contrast interfaces. Strong early arrivals might also include water layer multiples of the direct arrival and depending on the processing requirements/objectives these may or may not be useful for imaging the water bottom. For large offset relative to water depth, the direct arrival may develop in guided waves with large amplitude signal.

Signal processing may simultaneously handle signals of strong and weak amplitudes. and consequently, may introduce noise or artifacts into the data. For example, some processing sequences involving a transform of the recorded data from the time-space domain to another domain, apply processing in that other domain, and transform the processed data back to the original domain. An example transformation domain is the plane wave domain (e.g. frequency wavenumber domain or intercept time slowness domain). The presence of strong and weak amplitude signal challenges the stability of the transform (e.g. its invertibility, artifact generation), requires tuning of the transform parameters (data preparation, sizes, padding, etc.), hence also increases testing time.

Among all strong early arrivals, the direct arrival (DA) is special, because even if it does not contain information on the subsurface, it contains information on the source wavefield that generates all the subsequent recorded wavefield, which includes the useful reflection arrivals. So adequate sampling (including sampling with dip), recording, and processing of the direct arrival can be useful for some data processing techniques to work, such as for techniques that rely on the consistency of the entire recorded wavefield in any given processing domain. One non-limiting example of such technique is the attenuation of free-surface related multiples wavefield using upgoing and downgoing decomposed wavefields, and its related applications. In OBS acquisition, multicomponent sensors are deployed to the seabed, and the decomposition of the wavefield into its upgoing and downgoing parts follows a combination of the pressure and vertical velocity components. Moreover, and assuming a stratified medium, the deconvolution of a combination of the upgoing and downgoing wavefield and direct arrival in the plane wave domain predicts the data without free surface effects: no free surface multiples, no source ghost. The deconvolution also removes the source signature effects. These techniques are referred as up/down deconvolution (UDD), downgoing demultiple (DGD) and Radial/down decon (RDD) and related techniques. For this operation to work, the recorded multicomponent wavefield data needs to be consistent in the plane wave domain, and as discussed above, the strong amplitude of the early and direct arrivals, the risk of clipping and coarse dip sampling in shallow water acquisition may limit the effectiveness of such processing methods. Other flows where the correct source signature is useful includes, but are not limited to, debubble and designature.

A solution to the issues discussed above includes removing the strong early arrival signal and replacing it using a modelled direct arrival. The modelling of the direct arrival generated by a seismic source array is based on the concept of "notional sources": a seismic source array of N guns can be treated as an equivalent array of N independent, noninteracting monopole sources, each generating a spherical wave. The source signature of each monopole is the "notional source".

In practice, notional sources data may come from the processing of near field hydrophone data, which may have been acquired in the field with the bulk of the OBS seismic data. Notional sources may also be obtained from source array modelling (e.g., using industry standard seismic source modelling/calibration software) based on the source array geometry and attributes.

The direct arrival at any receiver location can then be modelled as a superposition of N spherical waves that propagate in the water layer from each monopole source to the receiver. Source ghost effects may be accounted for in a similar way using free-surface mirrored monopoles and an estimate for the sea surface reflectivity. Pressure and particle displacement (or velocity or acceleration) components of the direct arrival may also be computed in a similar way. The modelling can be performed in the time-space domain or in any other domain like the plane wave domain. The modelled direct arrival will have source directional signature, source bubble, source ghost, propagation delay timing, and geometrical spreading effects.

The superposition of spherical waves may be implemented with different approaches. The simplest approach includes a sum of rays. This approach is fast and allows for a direct control of the amplitude of the modelled direct arrival. This approach may include modelling both near and far field signatures or be limited to far field only, depending on the needs. Here near field and far field refer to dominant terms as a function of the propagation distance between the source and the detector (far means far enough from the source array such that small changes in the measurement position do not significantly affect the signature apart from a 1/distance factor, i.e., the source array can be considered as a point source). Many other modelling approaches may be employed, including but are not limited to, injection of the notional sources in Finite Difference wave propagation engines.

The modelled direct arrival may be calibrated to the data at hand. This may use a survey specific scalar and the knowledge of the seabed reflection coefficient, both of which can be extracted from the data itself. In some instance, a calibration filter may be used. Such a filter may also be designed from the data. In addition to the direct arrival, and, if needed, water layer events may also be modelled similarly. Alternatively, the direct arrival may also be estimated directly from the multicomponent recorded data, such as using the downgoing data.

Injecting a replacement/modelled direct arrival also enables a much better dip sampling of the direct arrival, especially in shallow water. Injecting a far field direct arrival will give source directivity closer to the real directivity for deconvolution/designature of later events. By removing the strong early arrivals early in the processing, processing the data without these events and then reinjecting the direct arrival when needed makes each step in the processing more stable and avoid leakage of high amplitude noise through processing. It also overcomes some of the sampling limitations particularly in shallow water acquisition.

A known issue is that strong amplitude signal may cause recording infidelity. The amplitude generated by the source at the receiver is too large and over-drives the acquisition system. The dynamic range on the acquisition system determines how weak signals can be recorded at the same time as the direct arrival signal and since priority is given to the weak signal, the direct arrival signal might be compromised. The result is that the recorded amplitude of the waveform may be clipped/distorted. This typically may affect the early arrivals, particularly the direct arrival, and more so on near offset records/traces which are closest the source array. Modern acquisition systems may recover quickly from saturation and the recording distortion is limited to the waveform of the early arrivals. This undesired phenomenon depends on the characteristics of the source array, offset, water depth, geology (seabed stiffness in particular), and this may be investigated and mitigated during the survey acquisition design stage. In practice however, the dynamic range of the acquisition system might not be large enough to accommodate both the weakest subsurface reflection signal and the direct arrival so clipping may be observed in some data, and perhaps more often than initially thought because of the detection difficulty: e.g., any post acquisition filtering will further mask recording amplitude distortion. Clipping of early arrivals/direct arrival may cause issues in some processing methods as the recorded data is not fully consistent. Clipped data need to be detected early in processing and repaired/replaced with corrected waveform. Modelled direct arrivals can be useful for detecting and characterizing clipping.

Direct arrival signal may vary significantly with take-off angle, source/receiver azimuth angle in addition to the distance from the source. But in shallow water acquisition and if source sampling is sparse, limitation in acquisition may limit the sampling in angle (or dip) of the direct arrival. In a time-space record (e.g., a common shot gather or a common receiver gather), the dip represents the slope of an event, and the local dip of an event is related to its propagation angle in the water. The dip sampling limitation is a geometry effect. For example, with a typical source point interval of 50 m and an OBS acquisition in a water layer of 50 m, one receiver could record a signal with the following source receiver distances . . . −50, 0, 50 . . . m. This implies that in terms of propagation (take-off) angles the sampling of the direct arrival (which propagates directly from the source to receiver) is limited to . . . , −45, 0, 45, . . . degrees. Consequently, there is no recording of the direct arrival in between 0 and 45 degrees, in that example. But reflected arrivals for the same offset range have a longer travel path within the subsurface and smaller propagation angle variation and hence will be more correctly sampled in terms of dip with typical shot sampling. This illustrates an inconsistency in the dip sampling between early arrivals/direct arrival and later reflected arrivals in a seismic record. This may have consequences when processing is applied in the plane wave domain as the transformation from time-space to plane wave domain aims at mapping the data with common propagation angle. Not all events in the seismic record will be mapped accurately in the plane wave domain. The amplitude of the direct arrival at small angle will essentially result from a coarse interpolation process. Whereas the amplitude of the reflected data in the transform domain will be more accurate. This is another example of wavefield inconsistency, highlighting the sampling of direct arrival in shallow water acquisition. For acquisition in deeper water, this is usually not an issue.

In one non-limiting example, the disclosed workflow allows for wavefield consistency in a transform processing domain. The disclosed workflow provides for removing (e.g., attenuating) any strong early arrivals from a recorded data record that do not contribute to the envisaged demultiple processing nor contribute to the image of the subsurface. The recorded direct arrival is also removed from the data record. This leads to a stable plane wave mapping of the remaining wavefields (which includes all recorded reflection events primaries, multiples). The disclosed workflow continues by inserting the calibrated modelled direct arrival in the plane wave domain into the remainder of the data record. The disclosed workflow continues by performing desired processing deconvolution with consistent wavefields, repaired direct arrival, and data mapped in the plane wave domain with minimal artefacts.

The above workflow is not limited to the prediction of multiple free data, but can be applied in variations of the scheme: multicomponent data, prediction of upgoing or downgoing multiples of any orders. It can also be applied for designature and deghosting. In all these variations, the consistency of the complete wavefield in the processing domain is used. The wavefield consistency is also used in a more general workflow of the demultiple scheme that does not assume a stratified medium. Processing can decide which part of the direct arrival needs to be modelled and inserted into the remainder of the data: both near and far fields direct arrival contributions, or only the far field direct arrival contribution. Other processing techniques may use the direct arrival replacement strategy.

Clipping detection can also be performed with a modelled direct arrival process. The modelling strategy can have a direct control on the amplitude. If modelled notional sources are in units of Bar-m (pressure-meter), the modelled pressure direct arrival will then be in Bar. Physical units for the particle components (displacement, velocity or acceleration as required) of the direct arrival wavefield can be derived knowing the acoustic properties of the water. The effect of sensors and acquisition system (instrument filters and sensitivity constants) can be applied to the modelled data and hence this would simulate the recorded data waveform of the direct arrival. The detection of clipping and its characterization follows the comparison of recorded and simulated data.

The chosen processing domain need not to be the plane wave domain. For example, processing may be done directly in the time-space domain and hence the DA modelling and insertion may be done in the time-space domain. Alternative to direct arrival modeling may be possible. Direct arrival replacement using direct arrival from deeper part of the survey may also be used.

Modelled direct arrival can be used to remove the direct arrival as well as to insert a correct direct arrival. To limit the transformation noise, for example in Radon transform, the direct arrival can be removed before the transform and then inserted after the transform.

When processing OBS data, the direct arrival is useful for the modern and efficient processing flows in the wavenumber domain for demultiple, designature and deghosting. To get the best possible data for this processing, a direct arrival is used which represent the far field signature. In the present context, a far field signature means that the signature is far enough from the source array such that small changes in the measurement position does not significantly affect the signature apart from a 1/distance factor (i.e., the source array can be considered as a point source). Also, when processing in wavenumber domain, the transformation noise caused by the large amplitude of the direct arrival is limited.

The disclosed method is not limited to cases where additional processing is done with the data without strong direct arrival and processing is not in time domain. The disclosed method also includes the replacement of the strong early arrival, particularly if it is clipped, with the optimum direct arrival. In some examples, the strong early arrival removal removes all the direct arrival which travels through the water, as well as interface waves, and strong refractions when present. When relevant, the guided wave of energy trapped in the water column is also removed. The correct direct arrival is then generated.

Figure 4:
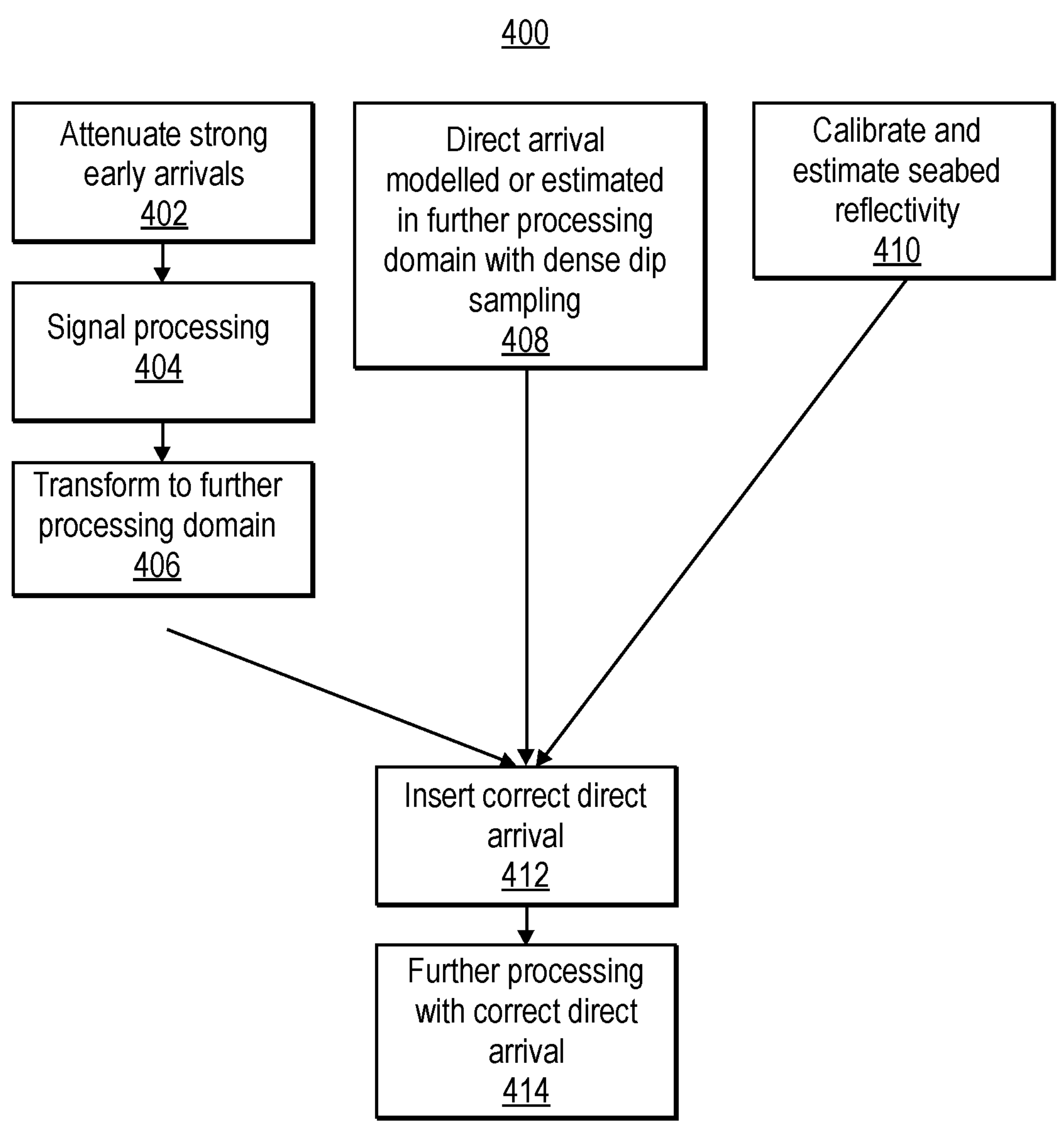
FIG. 4 illustrates a flowchart of a method for strong early arrival replacement according to examples of the present teachings.

FIG. 4 is a flowchart for a method 400 for strong early arrival replacement according to examples of the present teachings. The input to the process is previously recorded signals that were generated by one or more acoustic transmitting devices and received by one or more receiving devices with or without pre-processing and stored as an intermediate or temporary data. The method 400 begins by attenuating strong early arrival signals, as in 402. The attenuation can include up to complete removal of all strong early arrival signals. The strong early arrival signals that are to be attenuated typically involve modelling and adaptive subtraction over a time window, but is not limited to such methods. The method 400 continues by performing signal processing on the attenuated signal, as in 404. For example, the signal processing can include noise attenuation processing on the attenuated signal. Any processing which does not need the DA and which are not designed to correctly handle the DA will leave additional noise if DA is included. The method 400 continues by transforming the signal from 404 to a processing domain which can be different from the initial processing domain, as in 406. The initial processing domain can be the time-space domain (t, x, y) or in a domain other than the time-space domain. Examples of other domains include, but are not limited to, the intercept-slowness or linear Radon (tau-p) domain, the parabolic Radon (tau-q) domain, the frequency-wavenumber (f-k) domain and the curvelet domain. For example, if the initial processing domain is the time-space domain, the transformed processing domain can be any of the above-listed other domains or domains that are other than those listed above. For example, removing the direct arrival in the time-space domain reduces the signal dynamic range and gives less transformation noise in the Radon transform. The direct arrival is then injected directly into the tau-p-q domain. This transformation is applicable to all water depths. For very large gathers, e.g., receivers, the transformation cost can be high if the data is to be resampled to be spatially unaliased to all frequencies at all offsets. Removing the direct arrival allows a sparser sampling of the data with offset and reduced maximum frequency with offset. By largely reducing the spatial sampling requirement, the direct arrival can be directly injected in the tau-p-q domain.

Coincident with, before or after the attenuation of 402, the method 400 includes estimating the direct arrival in the processing domain of 408. For example, the direct arrival can be modeled using Calibrated Marine Source (CMS) modeling or finite difference modeling (FDM) for the correct angle and azimuth based on the notional signatures or can be estimated from the recorded data. As known in the art, CMS modeling is a modeling approach for performing an accurate shot-by-shot source signature that uses the recorded near-field signatures for every gun in the array to generate an estimated far-field signature or wavelet for each shot and optionally at different take-off angles and for different source to receiver distances. Each shot record can then be deconvolved relative to the average far-field signature to provide a common vertical signature for every shot in the survey. In some instances, the near or far-field offset is chosen prior to the modeling. Also as known in the art, FDM uses finite-difference (FD) operators for numerical evaluation of the derivatives of functions (e.g. the wavefield) appearing in the wave equation. Thus, a discrete version of the wave equation is derived where the wavefield is propagated starting from the source location (the initial condition). Whichever modeling is chosen and because the hydrophone response is omnidirectional, a global scalar is used to calibrate the modeled data for injection. Also, in either modeling method chosen, the seabed reflectivity at the receiver is used for the modeling. Further, for the modeling method chosen, the vertical geophone data is scaled according to take-off angle. Coincident with, before or after the attenuation of 402 and the modeling of 408, the method 400 includes estimating scalar and seabed reflectivity, as in 410. The method 400 continues by inserting the modeled direct arrival signal into the desired transformed domain, as in 412, based on the output of the transforming of 406, the modeling of 408, and the estimation of 410. The insertion of the modeled direct arrival involves a modeling step and a calibration step, which may use a scalar and a seabed reflection coefficient. The method 400 continues by further processing the signal with the modeled direct arrival included, as in 414. For example, the further processing can include, but is not limited to, free-surface demultiple of the upgoing (UDD) and downgoing (DGD) wavefields.

Figure 5:
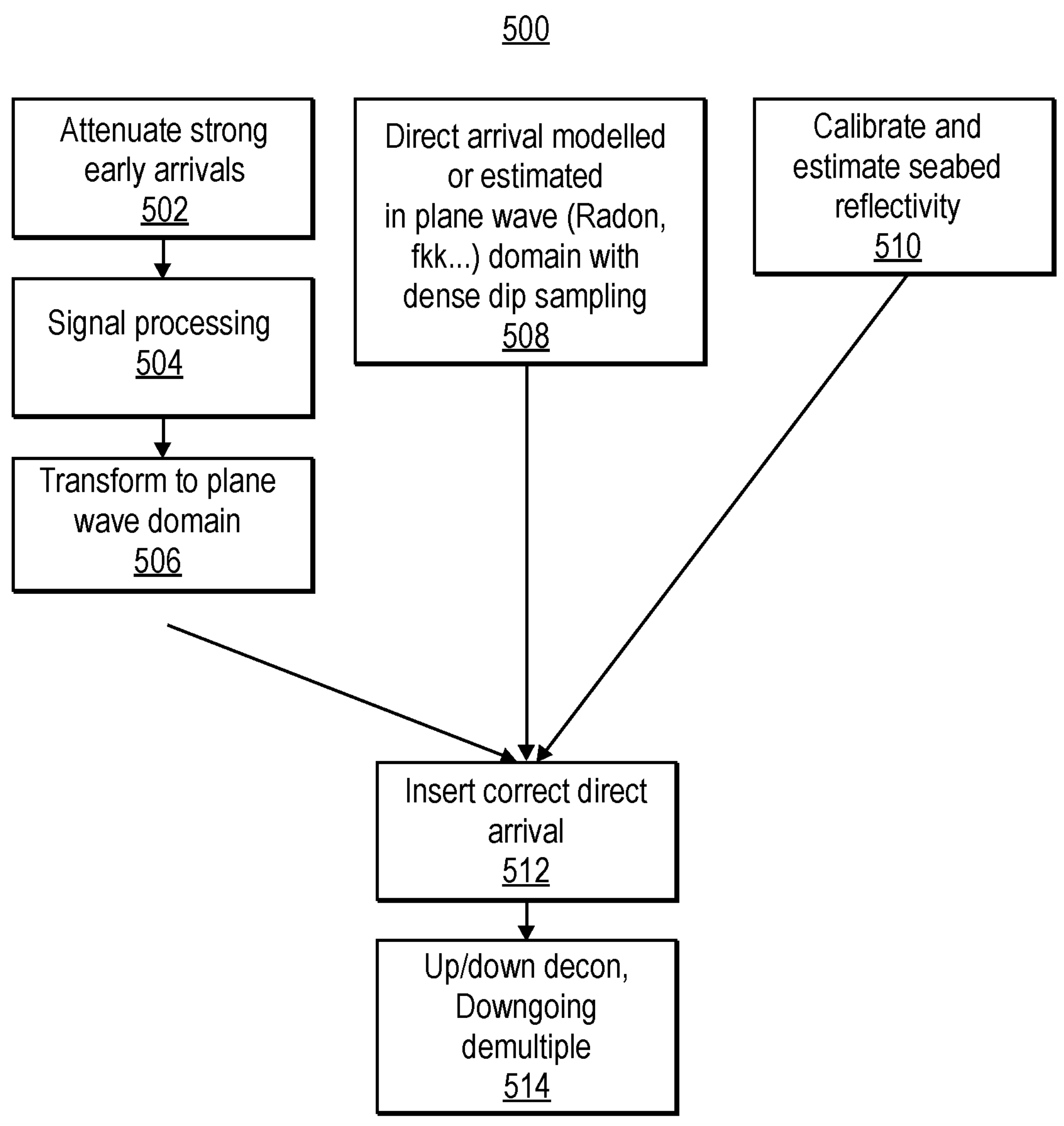
FIG. 5 illustrates a flowchart of a method for replacing clipped direct arrivals according to examples of the present teachings.

FIG. 5 is a flowchart for a method 500 for replacing direct arrivals according to examples of the present teachings. The input to the process is previously recorded signals that were generated by one or more acoustic transmitting devices and received by one or more receiving devices with or without pre-processing and stored as an intermediate or temporary data. The method 500 begins by attenuating at least direct arrival signals and guided waves, as in 502. The attenuation can include up to complete removal of the strong early arrival signals. The method 500 continues by performing signal processing on the attenuated signal, as in 504. For example, the signal processing can include noise attenuation processing on the attenuated signal. Any processing which does not need the DA and which are not designed to correctly handle the DA will leave additional noise if DA is included. The method 500 continues by transforming the signal from 504 to a processing domain which can be different from the initial processing domain, as in 506. Coincident with, before or after the attenuation of 502, the estimation of 504, and the modeling of 506, the method 500 includes determining CMS far-field signatures, as in 508. The output direct arrival to be inserted in the data in plane wave domain is sampled dense enough to get good dip sampling in that domain and not limited to the sampling on the seismic input data. Coincident with, before or after the attenuation of 502, the method 500 includes estimating scalar and seabed reflectivity, as in 510. The method 500 continues by replacing the direct arrival signal, as in 512, based on the output of the attenuation of 502, the estimation of 504, the modeling of 506, and the CMS far-field signatures of 508. The method 500 continues by further processing the signal using UDD, DGD, and RDD, as in 514.

Figure 6:
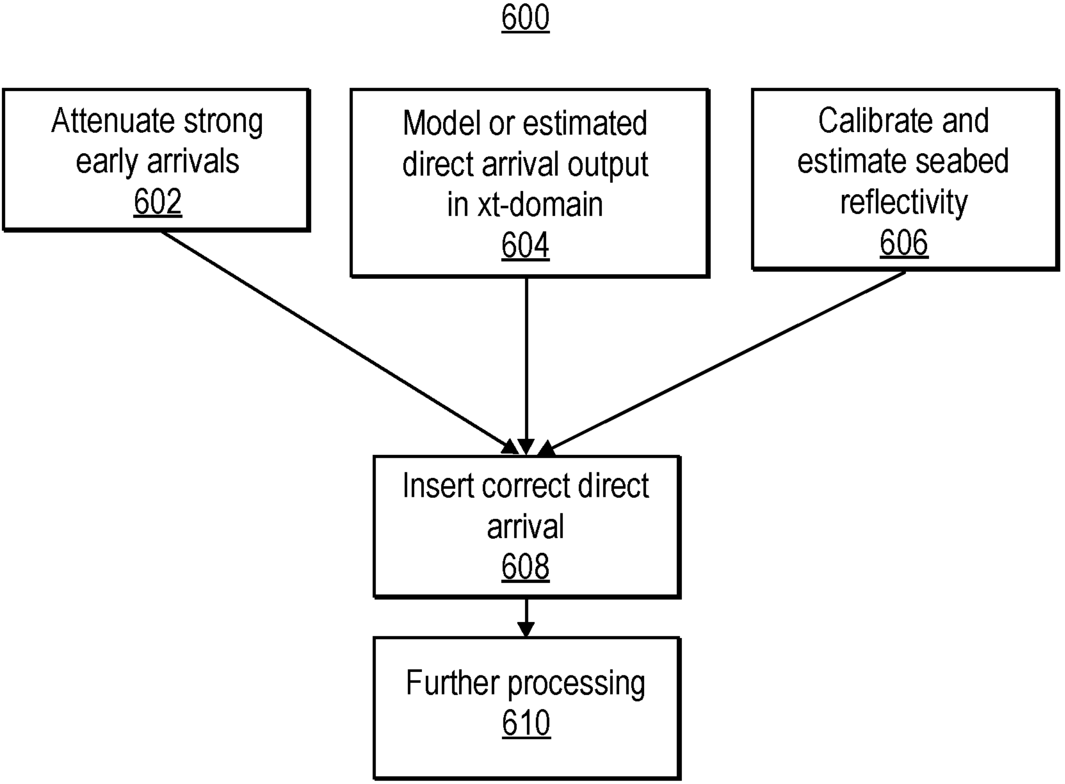
FIG. 6 illustrates a flowchart of a method for replacing direct arrivals according to examples of the present teachings.

FIG. 6 is a flowchart for a method 600 for replacing clipped direct arrivals according to examples of the present teachings. The input to the process is previously recorded signals that were generated by one or more acoustic transmitting devices and received by one or more receiving devices with or without pre-processing and stored as an intermediate or temporary data. The method 600 begins by attenuating at least direct arrival signals and guided waves, as in 602. The attenuation can include up to complete removal of the strong early arrival signals. Coincident with, before or after the attenuation of 602, the method 600 includes modeling far-field signatures output in a first processing domain, as in 604. The first processing domain is in the time-space domain (t, x, y). For example, the far-field signatures can be modeled using CMS modeling or FDM. Coincident with, before or after the attenuation of 602 and the modeling of 604, the method 600 includes estimating scalar and seabed reflectivity, as in 606. The method 600 continues by inserting the correct direct arrival signal, as in 608, based on the output of the attenuation of 602, the modeling of 604, and the estimation of 606. The method 600 continues by further processing the signal with the correct direct arrival included, as in 610. For example, the further processing can include, but is not limited to, debubble and shot-by-shot designature. Further processing could be the method 500 for up/down convolution and downgoing demultiple.

Figure 7:
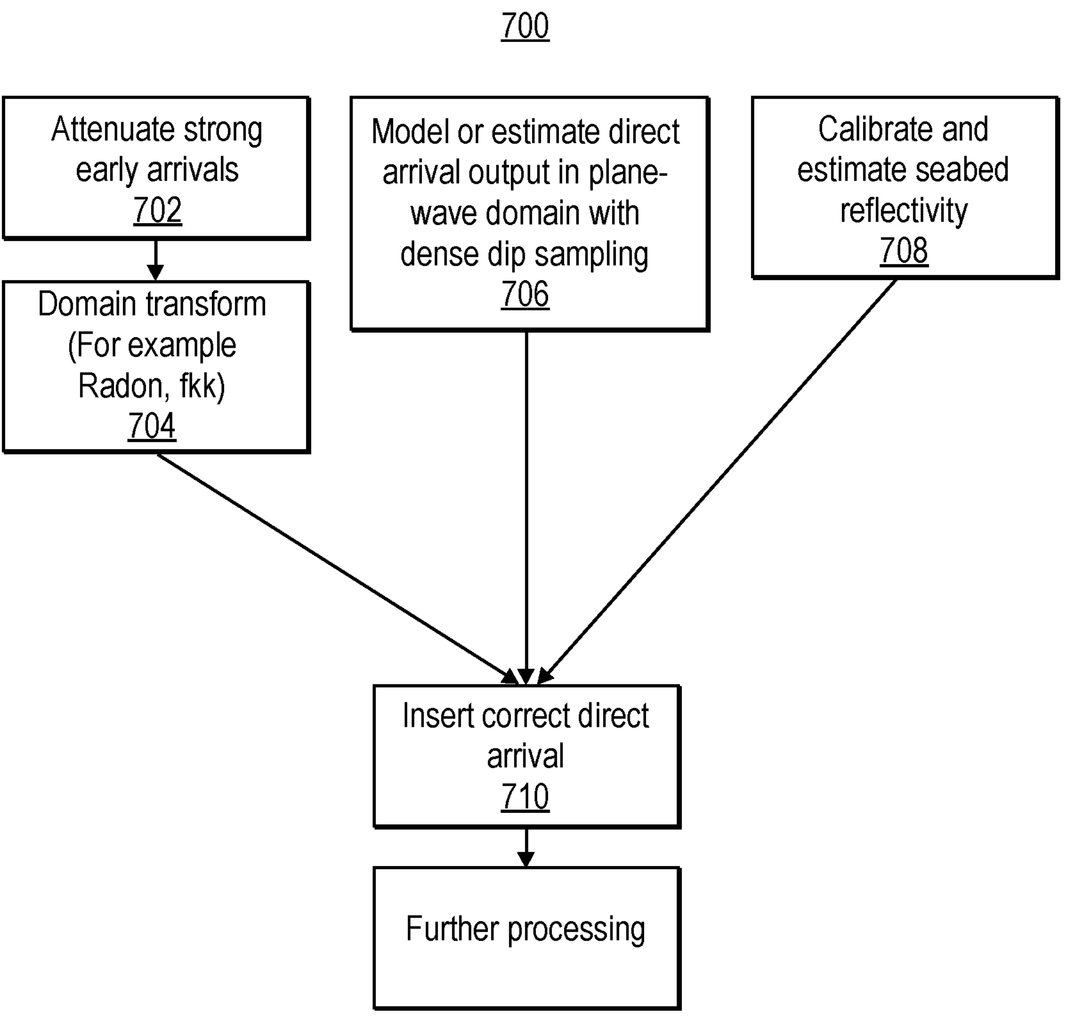
FIG. 7 illustrates a flowchart of a method for replacing direct arrivals according to examples of the present teachings.

FIG. 7 is a flowchart for a method 700 for replacing clipped direct arrivals in any processing domain according to examples of the present teachings. The input to the process is previously recorded signals that were generated by one or more acoustic transmitting devices and received by one or more receiving devices with or without pre-processing and stored as an intermediate or temporary data. The method 700 begins by attenuating at least direct arrival signals and guided waves, as in 702. The attenuation can include up to complete removal of the strong early arrival signals. The method 700 continues by transforming the signal from 702 to a processing domain which can be different from the initial processing domain, as in 704. Coincident with, before or after the attenuation of 702, the method 700 includes modeling far-field signatures output in a further processing domain, as in 704. For example, the far-field signatures can be modeled using CMS modeling or FDM. Coincident with, before or after the attenuation of 702 and the modeling of 706, the method 700 includes estimating scalar and seabed reflectivity, as in 708. The method 700 continues by inserting the correct direct arrival signal, as in 710, based on the output of the transform of 704, the modeling of 706, and the estimation of 708. The method 700 continues by further processing the signal with the correct direct arrival included, as in 710. For example, the further processing can include, but is not limited to, directional designature debubble and shot-by-shot designature. Further processing could also be up/down convolution and downgoing demultiple.

Figure 8:
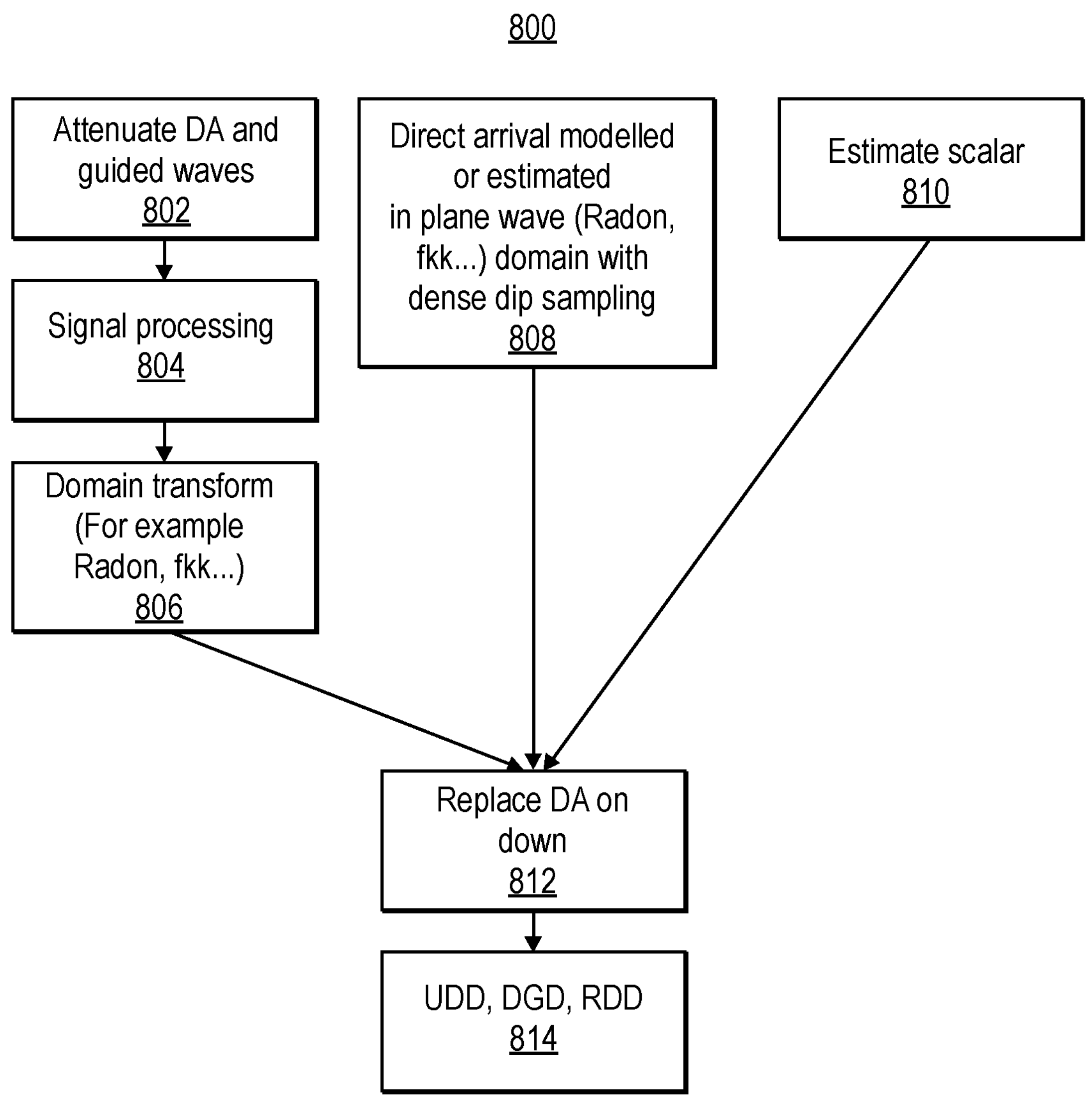
FIG. 8 illustrates a flowchart for a method for replacing direct arrivals according to examples of the present teachings.

FIG. 8 is a flowchart for a method 800 for replacing direct arrivals according to examples of the present teachings. The input to the process is previously recorded signals that were generated by one or more acoustic transmitting devices and received by one or more receiving devices with or without pre-processing and stored as an intermediate or temporary data. The method 800 begins by attenuating at least direct arrival signals and guided waves, as in 802. The attenuation can include up to complete removal of the strong early arrival signals. The method 800 continues by performing signal processing on the attenuated signal, as in 804. For example, the signal processing can include noise attenuation processing on the attenuated signal. Any processing which does not need the DA and which are not designed to correctly handle the DA will leave additional noise if DA is included. The method 800 continues by transforming the signal from 804 to a processing domain which can be different from the initial processing domain, as in 806. The transformed data is split into up-and downgoing data. Coincident with, before or after the attenuation of 802, the estimation of 810, and the modeling of 808, the method 800 includes determining CMS far-field signatures. The output direct arrival to be inserted in the data in plane wave domain is sampled dense enough to get good dip sampling in that domain and not limited to the sampling on the seismic input data. Coincident with, before or after the attenuation of 802, the method 800 includes estimating scalar, as in 810. The method 800 continues by inserting the direct arrival signal on the downgoing data only, as in 812, based on the output of the attenuation of 802, the estimation of 810, the modeling of 808, and the CMS far-field signatures. The method 800 continues by further processing the signal using UDD, DGD, and RDD, as in 814.

The above methods for direct arrival replacement can be used in both shallow water and in deep water. The measured direct arrival in shallow water might be the middle field or near field from the source array, while the direct arrival may be on the primaries and multiples which goes into deconvolution is the FFS. The replacement of the direct arrival in shallow water can include the following processes. A set of angle/azimuth dependent FFS for a given distance source to receiver is determined by modeling using the FDM. A set of angle/azimuth dependent FFS for a given distance source-to-receiver is then determined from the notionals. A set of angle/azimuth dependent FFS for a given distance source-to-receiver is then determined from the notionals in the tau-p-q domain. A scaling factor is then estimated from the data. Finally, a seabed reflectivity is then estimated. The replacement domain wavefield can include the following processes. Replace on P and Z in the space-time domain for a given seabed reflectivity. Replace on P and Z in the tau-p-q-domain for a given a seabed reflectivity. Replace on up and down in the tau-p-q-domain given a seabed reflectivity for up only. Perform UDD, DGD and/or RDD processing. For the UDD, the seabed reflectivity may not be needed if the direct arrival is only added to the downgoing data. In some examples, seabed reflectivity may also be estimated from the data. Also, cross-ghosting in tau-p-q domain may be used for direct arrival estimates and QC.

In the case of direct arrival replacement in deep water with ultralong offset, the direct arrival replacement can be used to remove the direct arrival, which is the only high frequency for long offset. As in a Radon transform, a sparser Radon transform can be used and the direct arrival injected in the tau-p-q domain. The replacement of the direct arrival in deep water can include the following processes. A set of angle/azimuth dependent FFS for a given distance source-to-receiver is determined by modeling using the FDM. A set of angle/azimuth dependent FFS for a given distance source-to-receiver is then determined from the notionals. A set of angle/azimuth dependent FFS for a given distance source-to-receiver is then determined from the notionals in the tau-p-q domain. A scaling factor is then estimated from the data. Finally, a seabed reflectivity is then estimated. The replacement domain wavefield can include the following processes. Replace on P and Z in the tau-p-q domain for a given seabed reflectivity. Replace on up and down in the tau-p-q-domain given a seabed reflectivity for up only. Perform UDD, DGD and/or RDD processing.

Figure 9A:
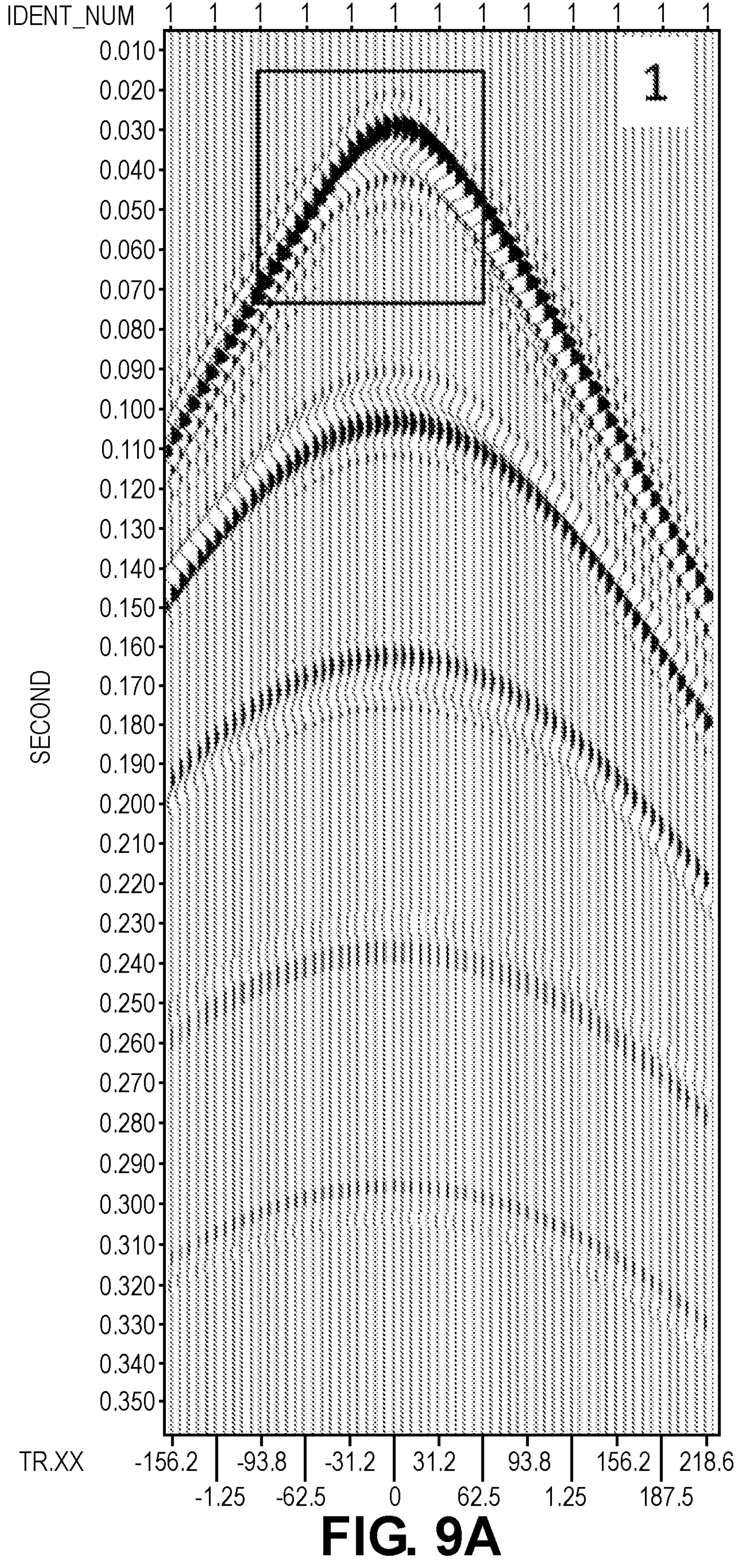
FIG. 9A, FIG. 9B, FIG. 9C, and FIG. 9D illustrate data according to examples of the present teachings.
Figure 9B:
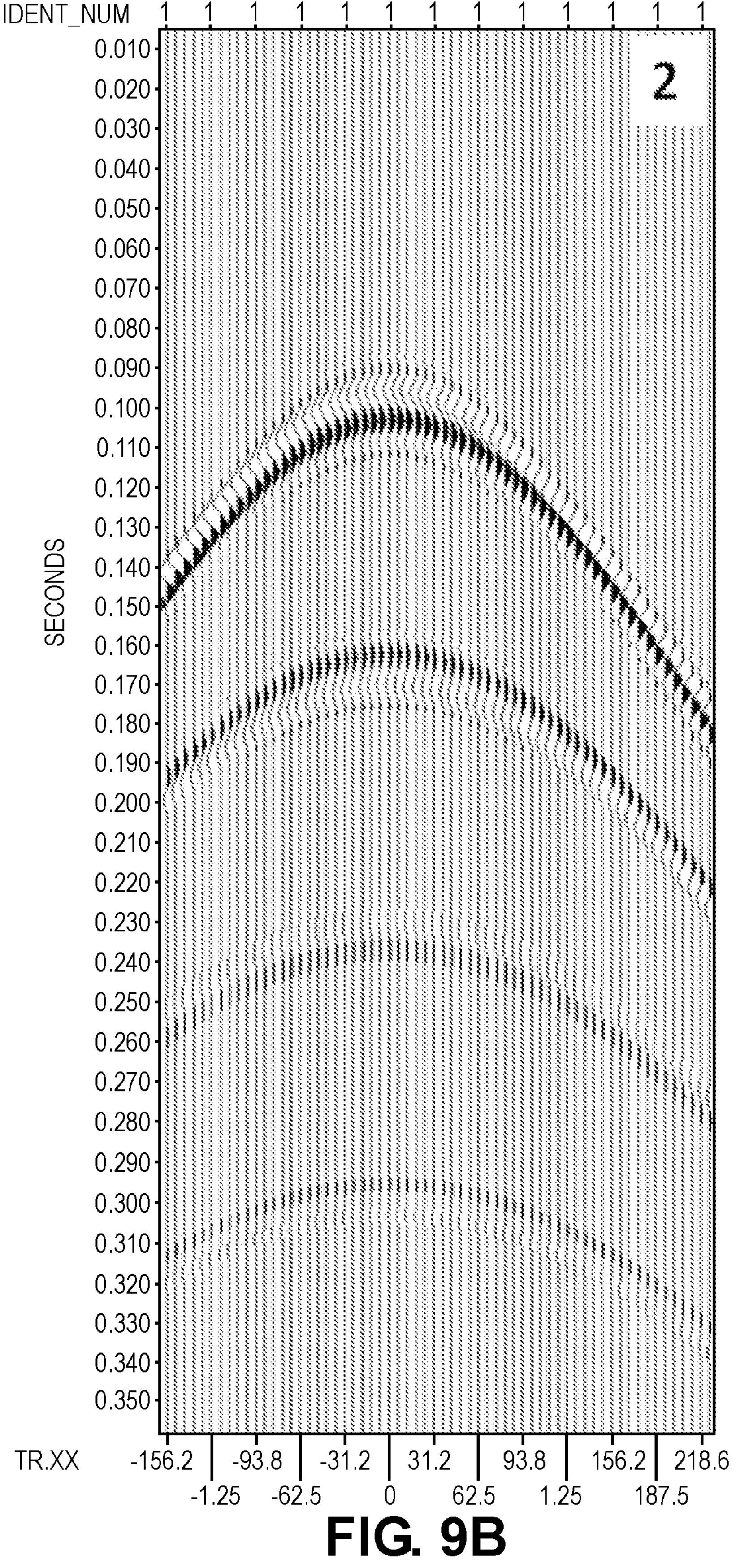
Figure 9C:
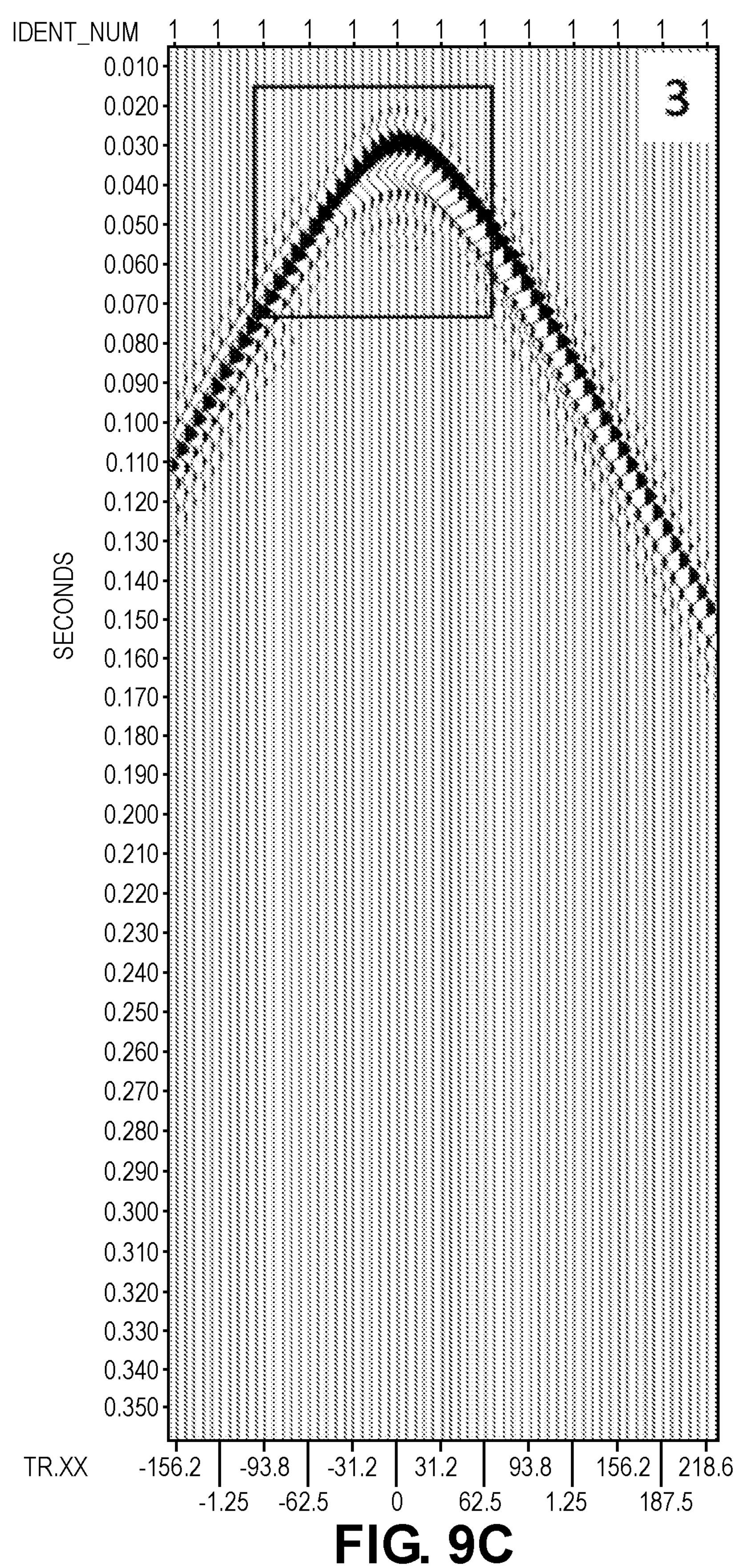
Figure 9D:
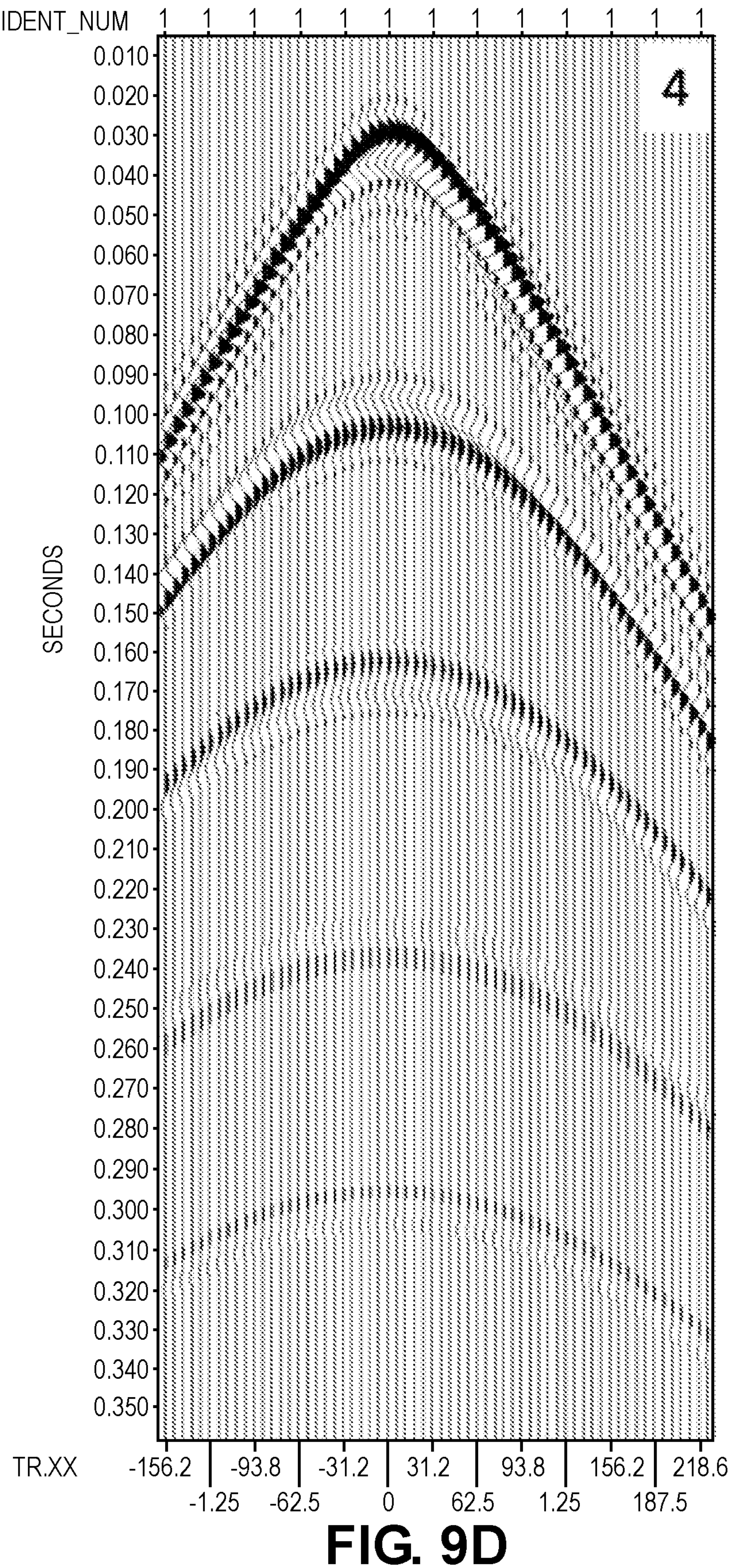

FIG. 9A, FIG. 9B, FIG. 9C, and FIG. 9D shows data according to examples of the present teachings. FIG. 9A shows input data with clipped DA in t-x domain. FIG. 9B shows input data with clipped DA removed in t-x domain. FIG. 9C shows modelled DA data after calibration (here only accounting for the seabed reflection effects) in t-x domain. FIG. 9D shows input data with repaired DA in t-x domain (i.e., insertion of FIG. 9B and FIG. 9C).

Figure 10A:
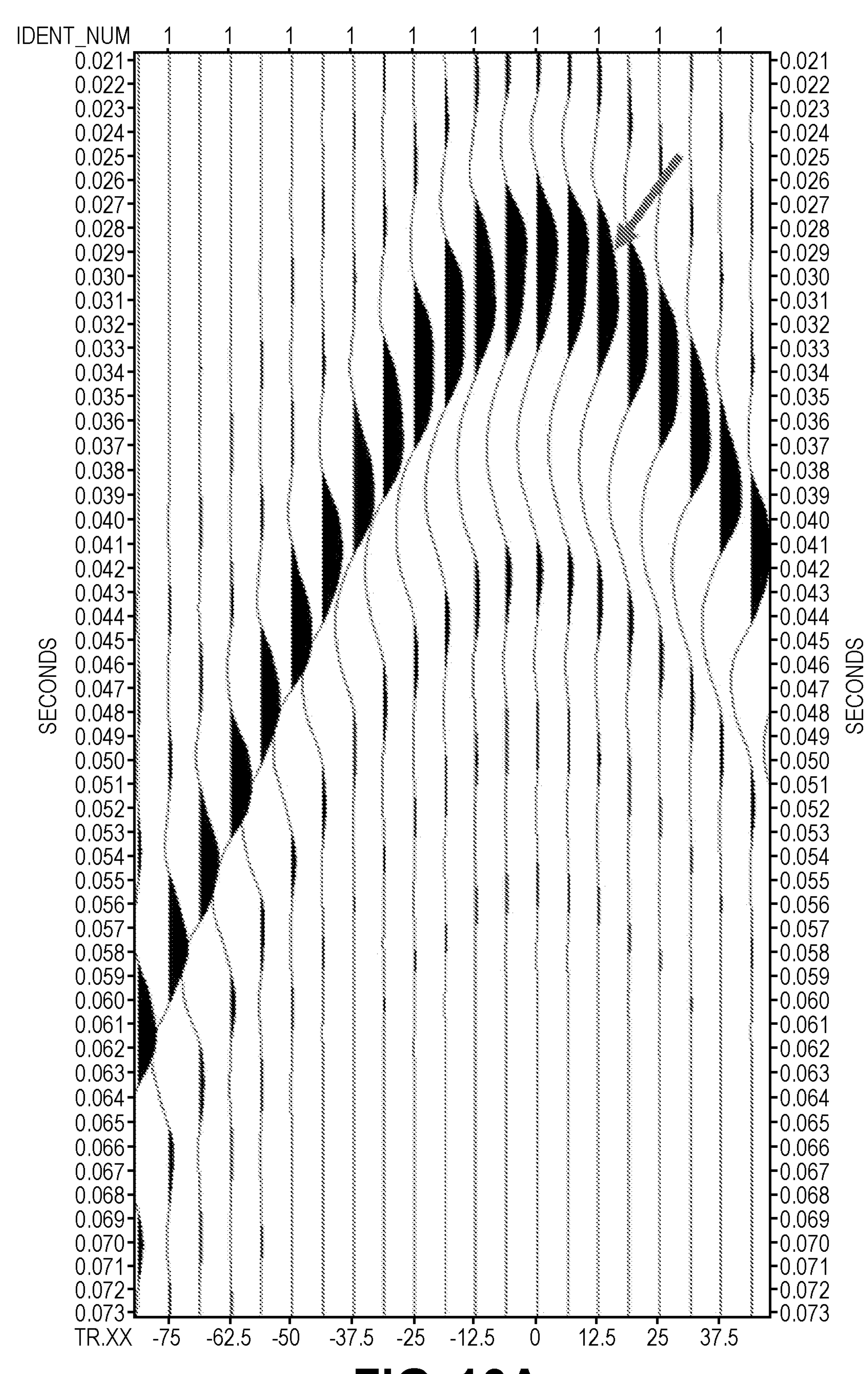
FIG. 10A, FIG. 10B, and FIG. 10C shows close ups of clipped (FIG. 10A) and modelled direct arrivals (DA) (FIG. 10B) in the rectangular data windows of FIG. 9A and FIG. 9C, respectively.
Figure 10B:
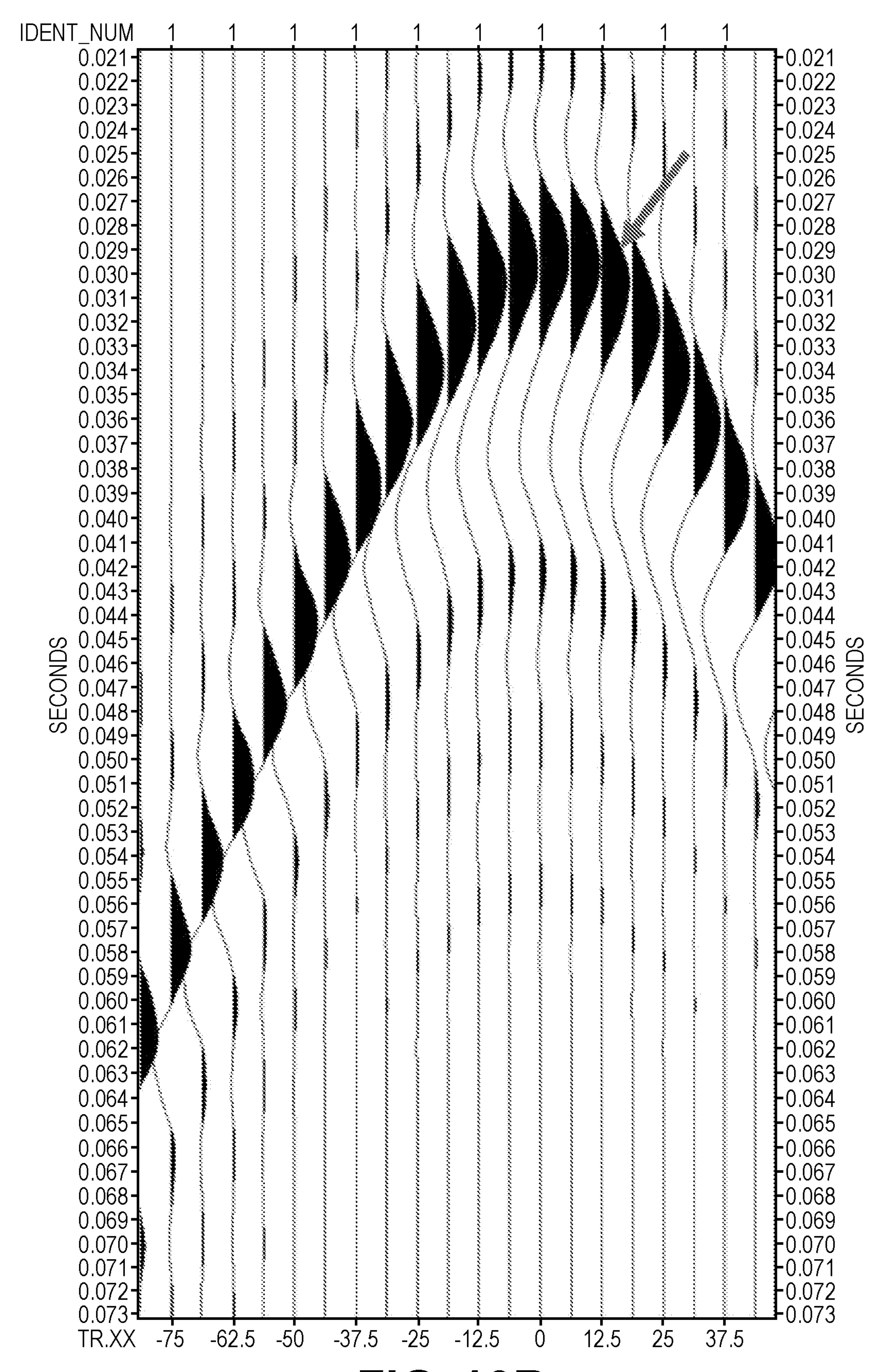
Figure 10C:
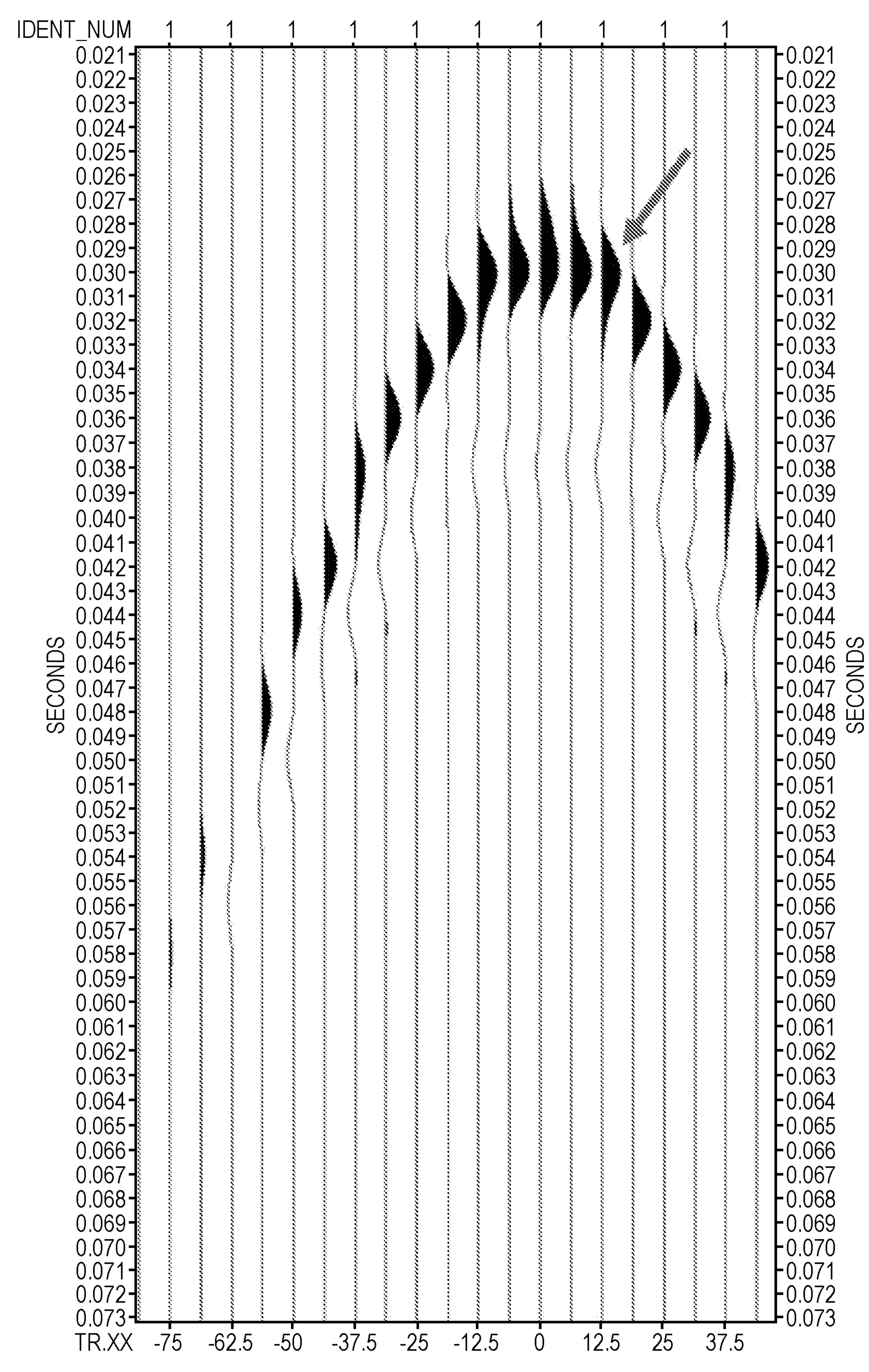

FIG. 10A, FIG. 10B, and FIG. 10C shows close ups of clipped (FIG. 10A) and modelled DA (FIG. 10B) in the rectangular data windows of FIG. 9A and FIG. 9C, respectively, and FIG. 10C shows the difference scaled by a factor of 2. The data are displayed with a T-gain and the bottom label=source detect distance. FIG. 10A shows a close-up of input data with clipped DA and FIG. 10B shows a close-up of modelled data after calibration (here only account for the seabed reflection effects). In this example, data with |source detect distance|<56.25 m are clipped. The cursor points to the first clipped trace.

Figure 11A:
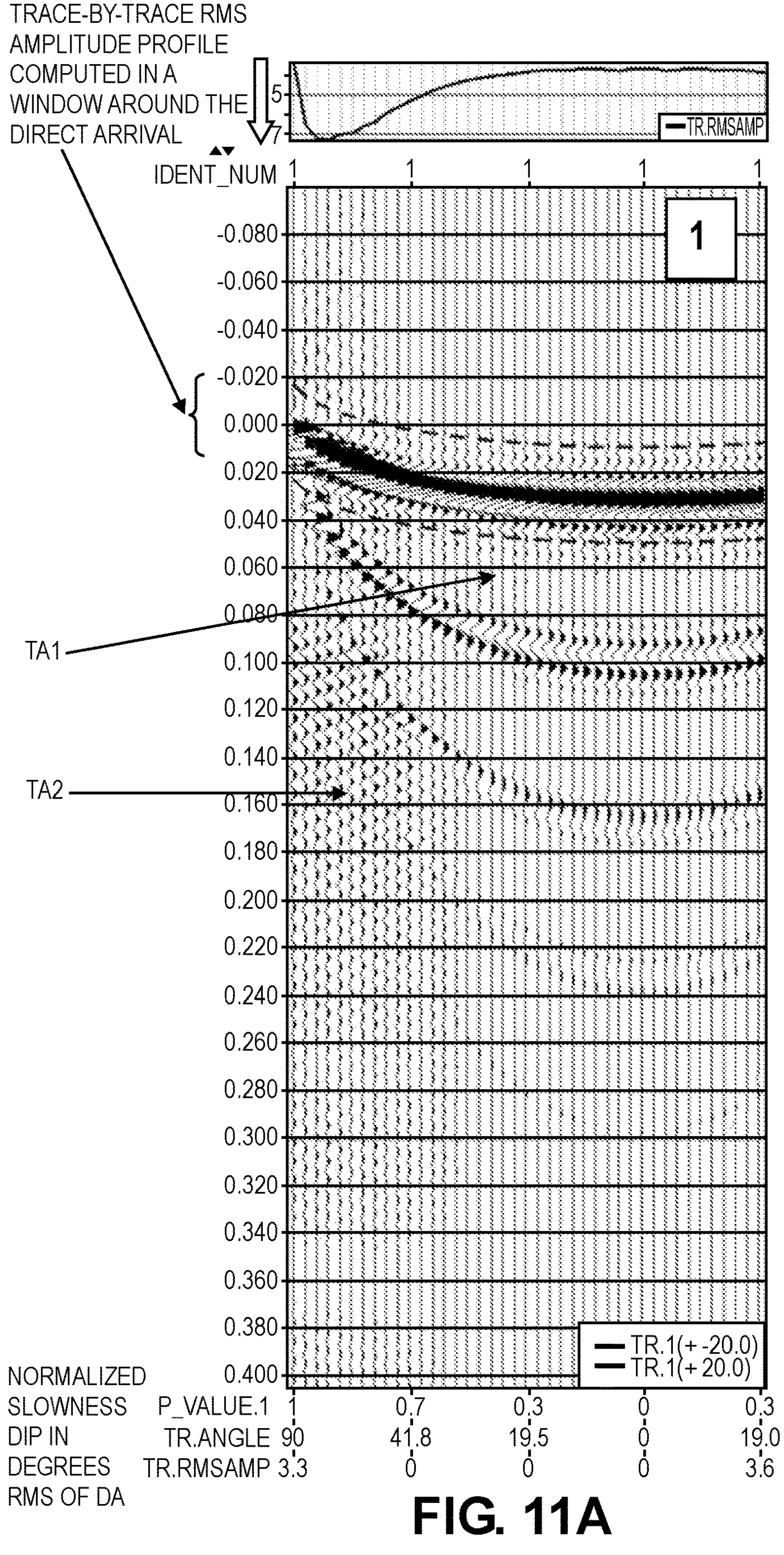
FIG. 11A, FIG. 11B, FIG. 11C, and FIG. 11D show data according to examples of the present teachings.
Figure 11B:
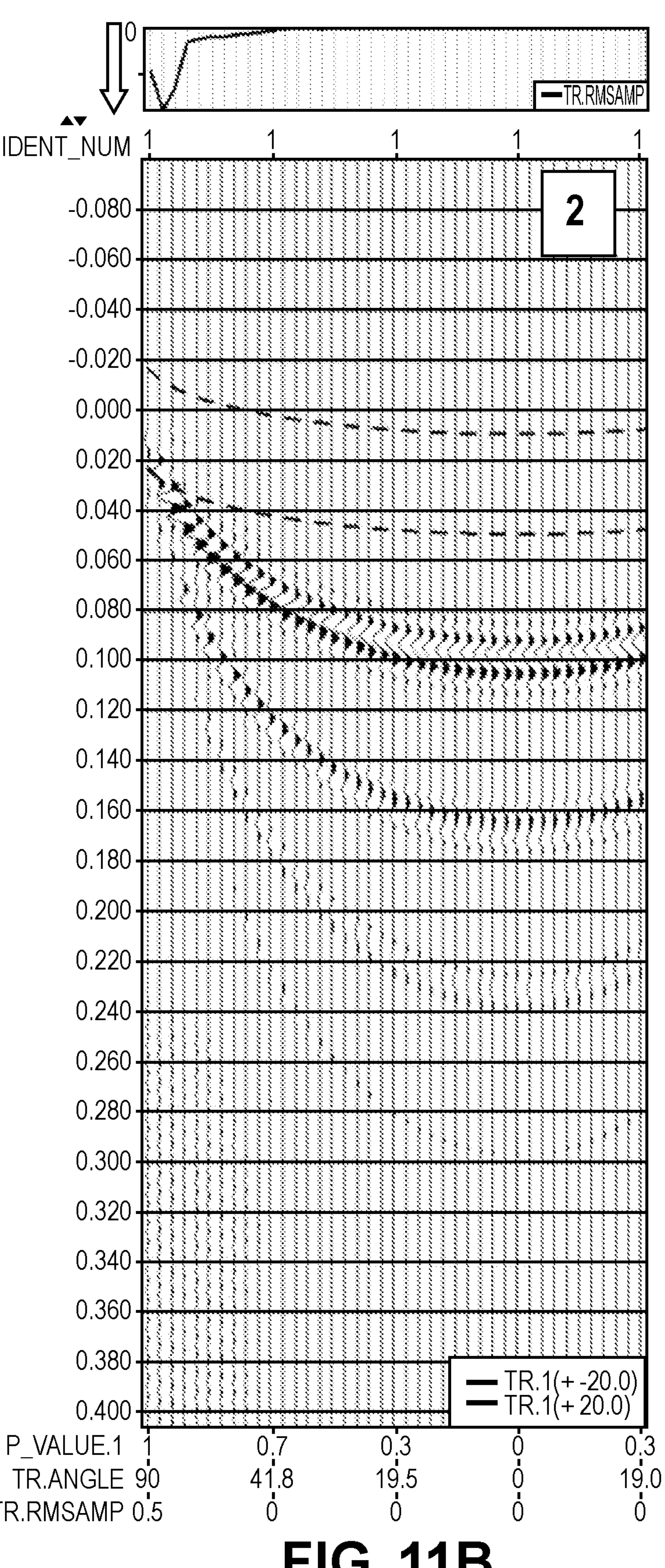
Figure 11C:
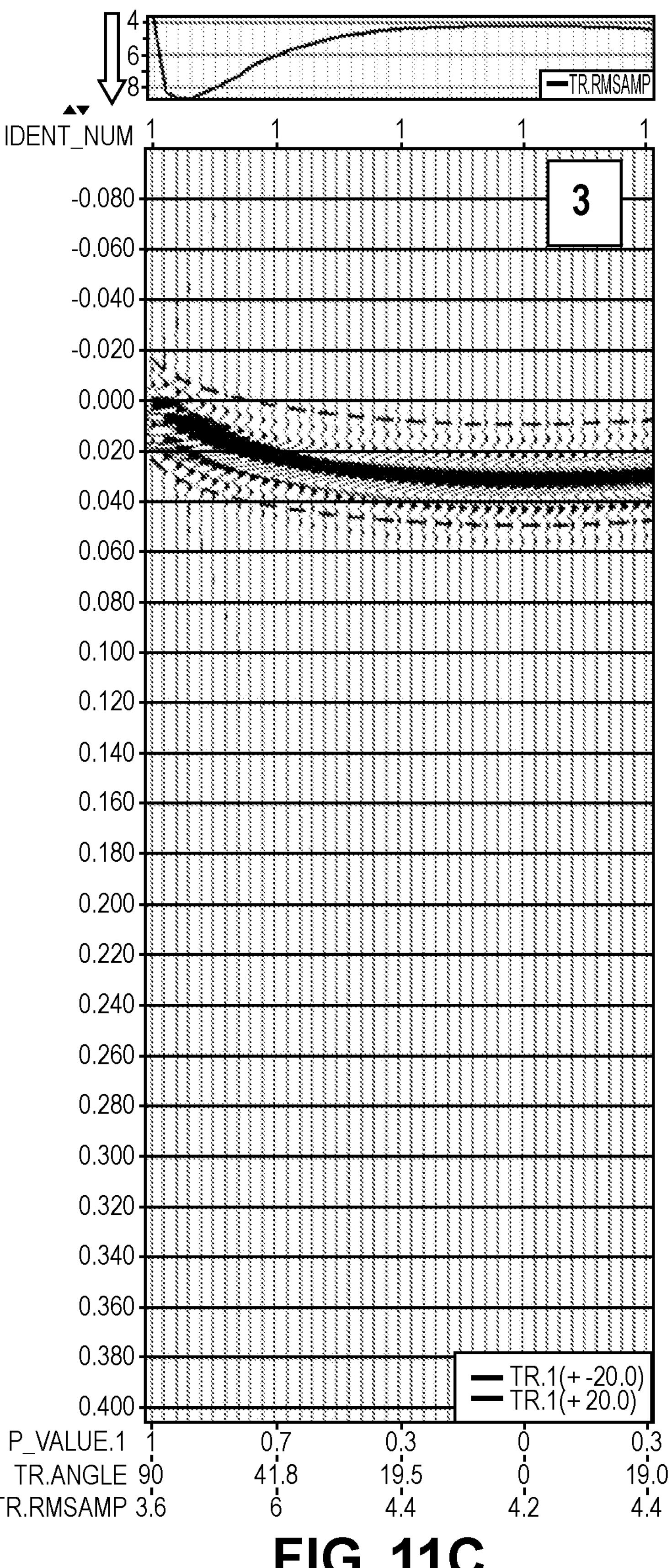
Figure 11D:
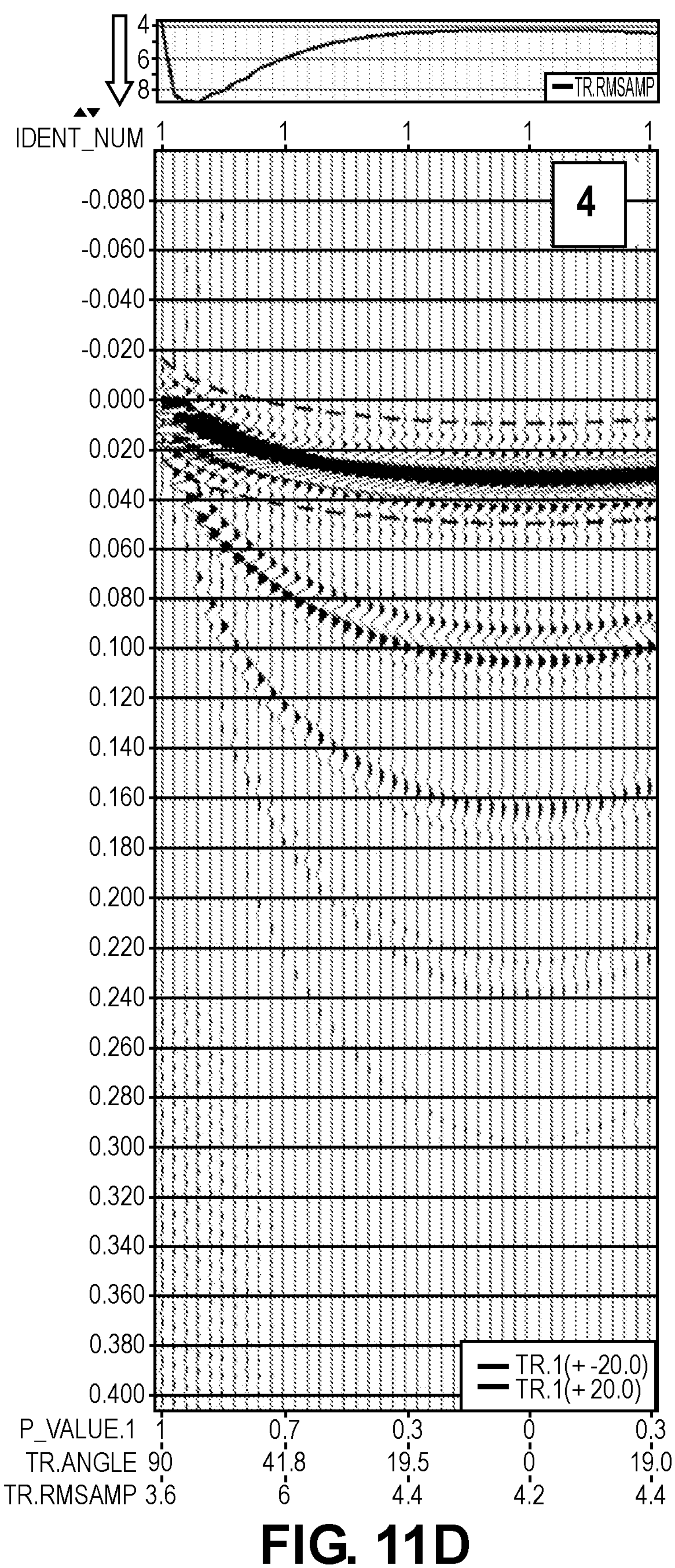

FIG. 11A, FIG. 11B, FIG. 11C, and FIG. 11D shows data according to examples of the present teachings. FIG. 11A shows tau-p domain of input data with clipped DA. FIG. 11B shows tau-p domain of input data with clipped DA removed. FIG. 11C shows tau-p domain model data after calibration and with dense dip sampling. FIG. 11D shows tau-p domain of input data with repaired DA (insertion of FIG. 11B and FIG. 11C). The bottom label1=normalized slowness and the bottom label2=dip in degrees.

Figure 12A:
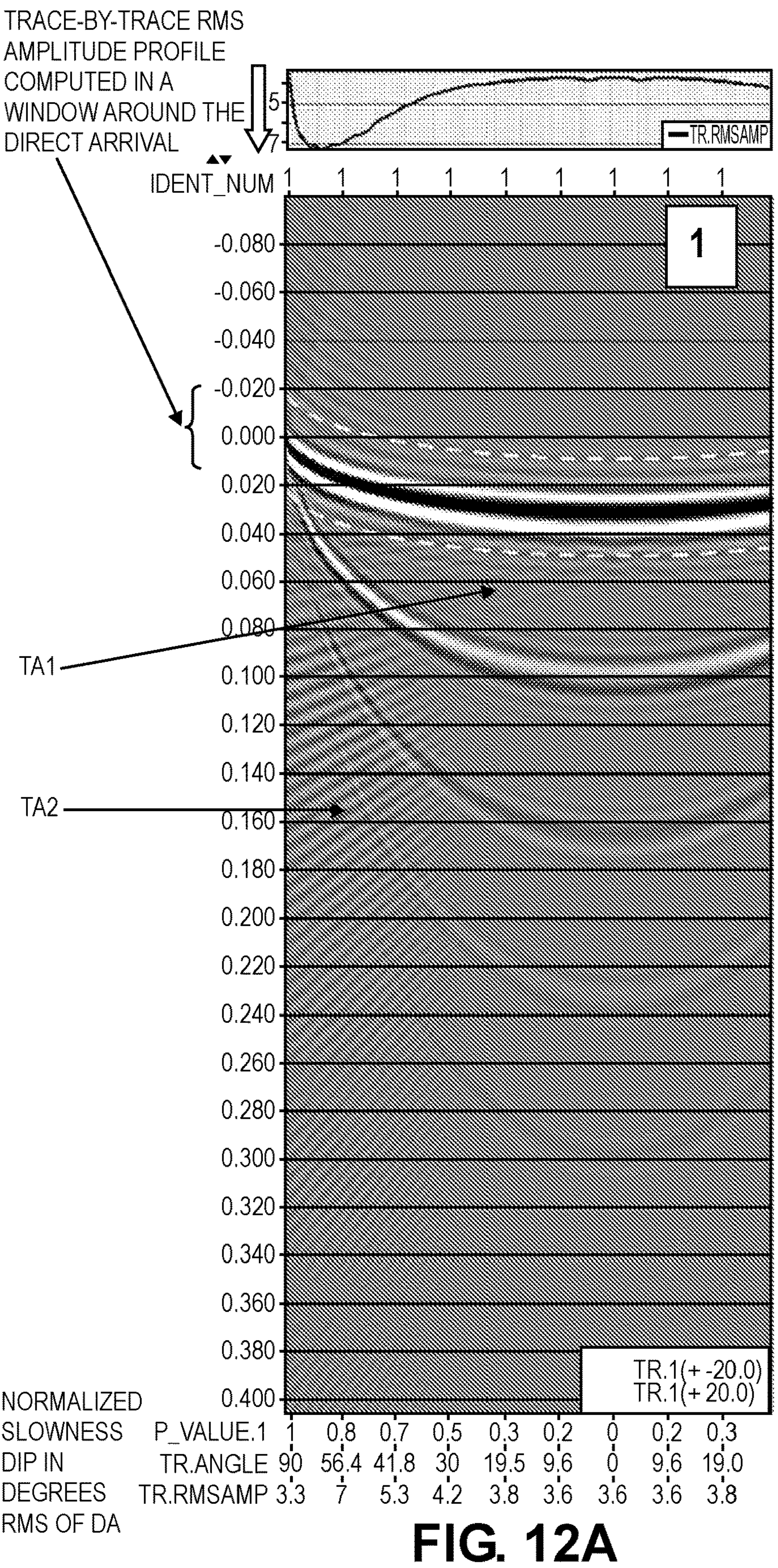
FIG. 12A, FIG. 12B, FIG. 12C, and FIG. 12D show data according to examples of the present teachings.
Figure 12B:
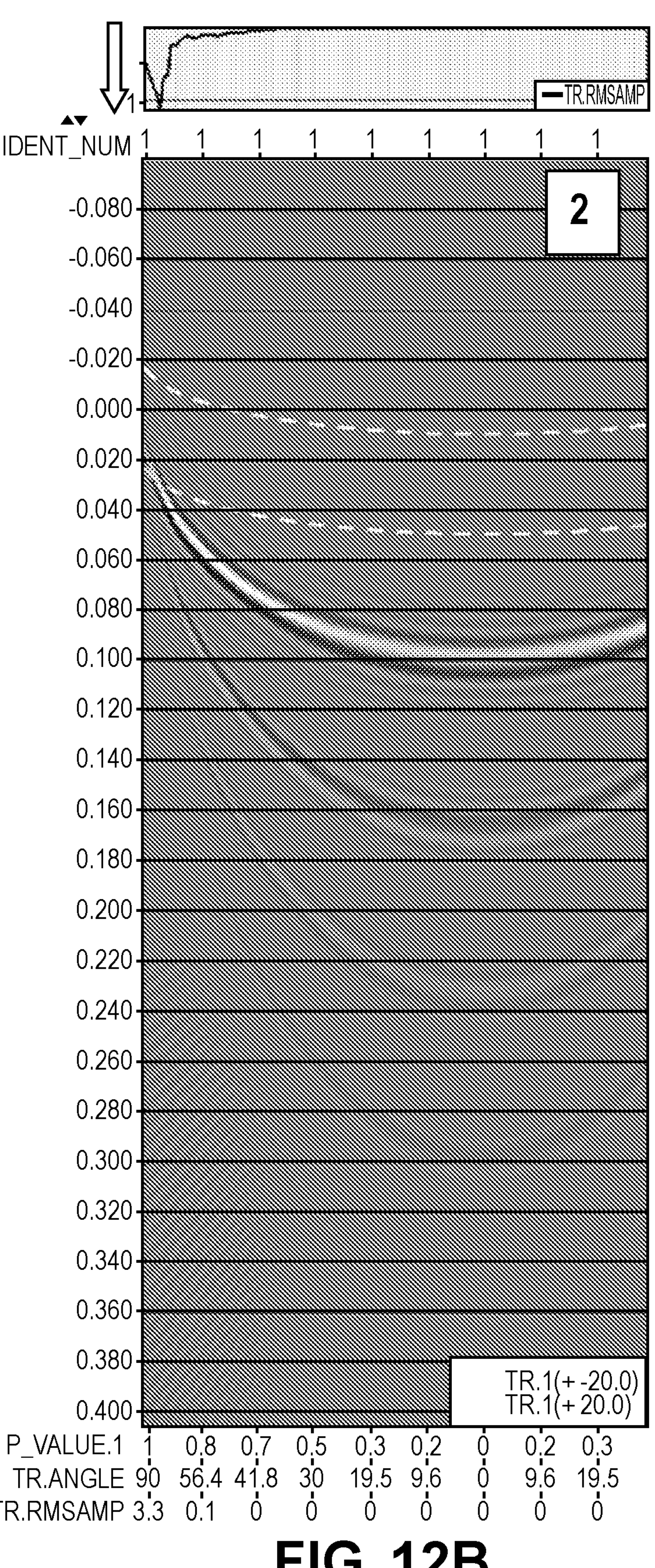
Figure 12C:
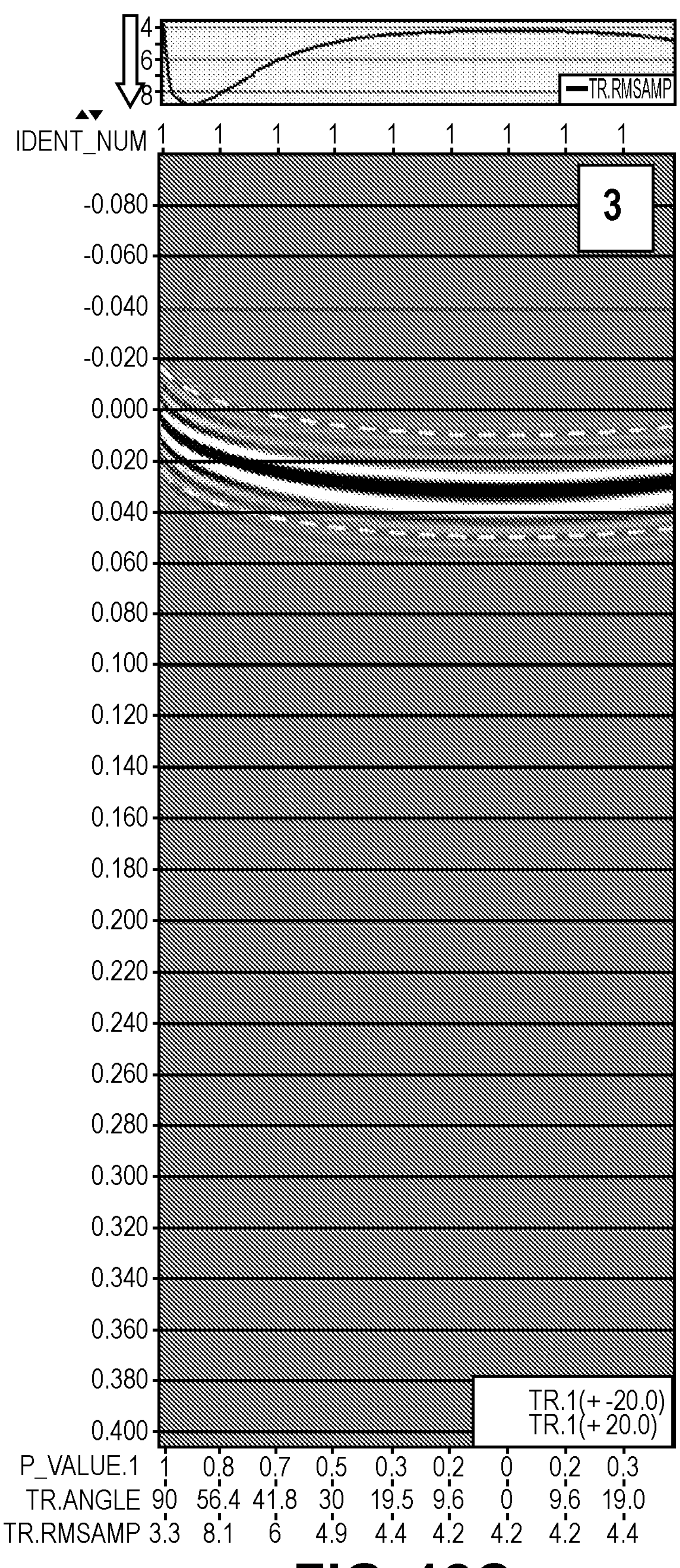
Figure 12D:
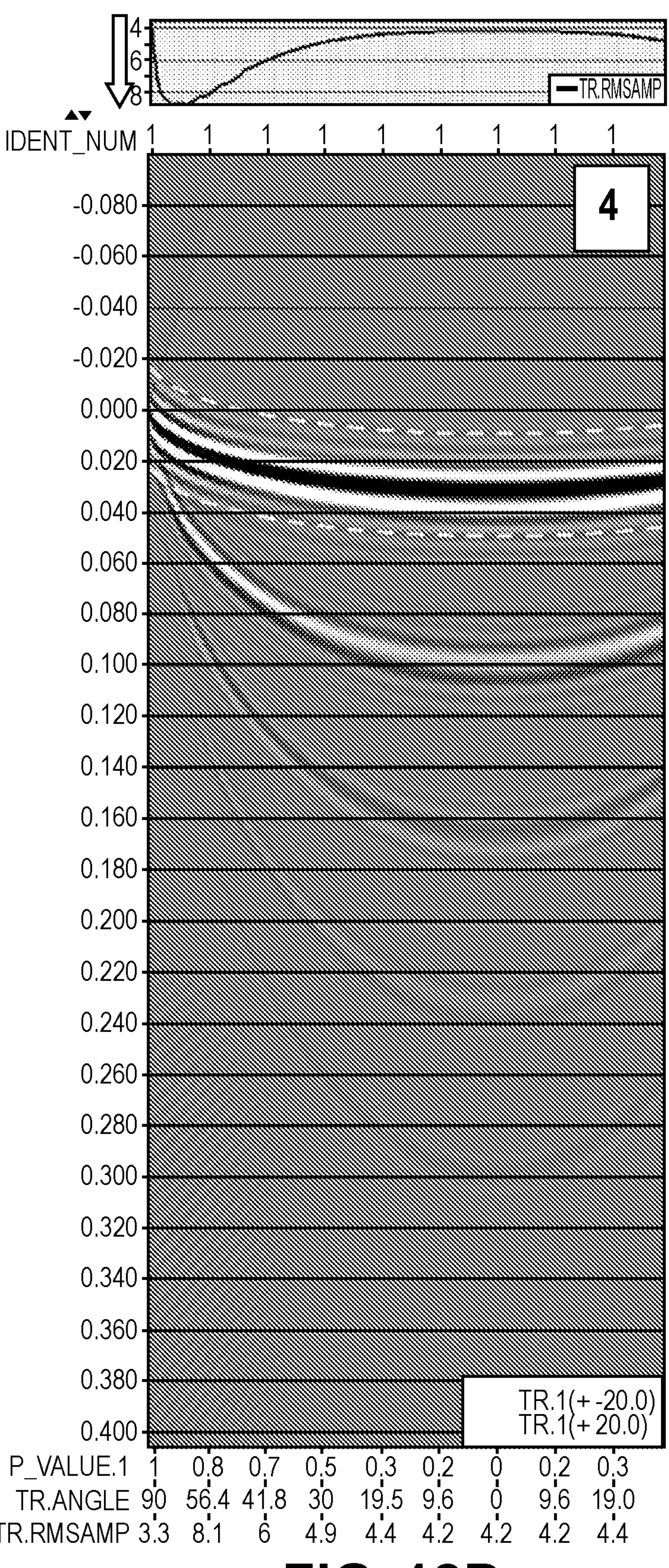

FIG. 12A, FIG. 12B, FIG. 12C, and FIG. 12D shows data according to examples of the present teachings. FIG. 12A shows tau-p domain of input data with clipped DA. FIG. 12B shows tau-p domain of input data with clipped DA removed. FIG. 12C shows tau-p domain model data after calibration and with dense dip sampling. FIG. 12D shows tau-p domain of input data with repaired DA (insertion of FIG. 12B and FIG. 12C). (TA1) and (TA2) point to some of the transform artefacts caused by the clipping and the sampling of the DA, respectively. Both artefacts (TA1) and (TA2) are reduced with the repaired DA in FIG. 12D. RMS amplitude in a window around the DA (marked by the dashed lines) is overlaid on the data panels (starting from t=300 ms and scaled by 10 for display purposes). It reflects the effect of clipping and the repair of the clipping in FIG. 12C and FIG. 12D. This will yield a better processing because of the consistency between the remainder data (FIG. 12B) and the inserted DA (FIG. 12C) in comparison to the original data (FIG. 12A).

In one or more embodiments, the functions described can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

Figure 13:
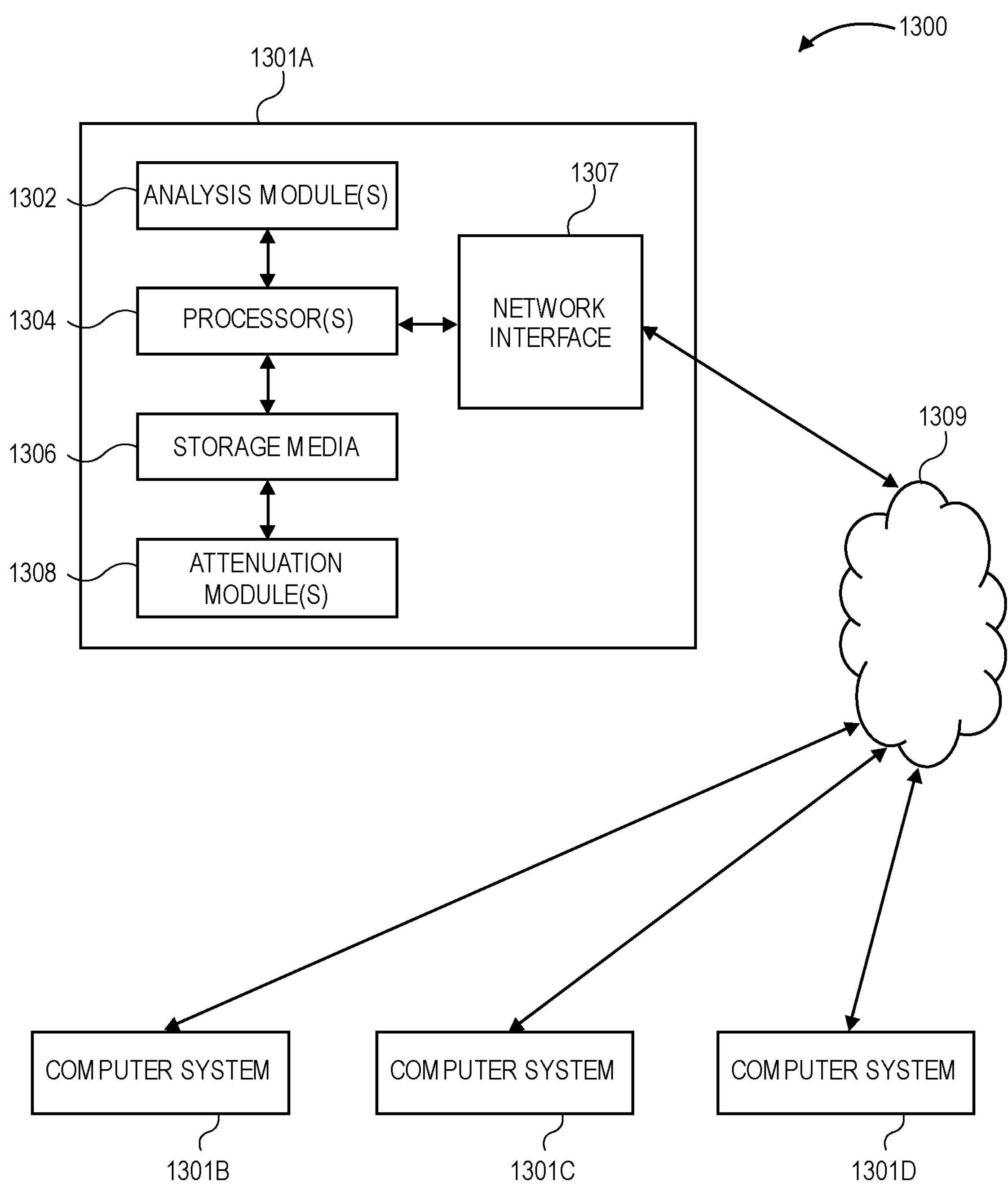
FIG. 13 illustrates a schematic view of a computing system, according to an embodiment.

In some embodiments, any of the methods of the present disclosure may be executed by a computing system. FIG. 13 illustrates an example of such a computing system 1300, in accordance with some embodiments. The computing system 1300 may include a computer or computer system 1301A, which may be an individual computer system 1301A or an arrangement of distributed computer systems. The computer system 1301A includes one or more analysis module(s) 1302 configured to perform various tasks according to some embodiments, such as one or more methods disclosed herein. To perform these various tasks, the analysis module 1302 executes independently, or in coordination with, one or more processors 1304, which is (or are) connected to one or more storage media 1306. The processor(s) 1304 is (or are) also connected to a network interface 1307 to allow the computer system 1301A to communicate over a data network 1309 with one or more additional computer systems and/or computing systems, such as 1301B, 1301C, and/or 1301D (note that computer systems 1301B, 1301C and/or 1301D may or may not share the same architecture as computer system 1301A, and may be located in different physical locations, e.g., computer systems 1301A and 1301B may be located in a processing facility, while in communication with one or more computer systems such as 1301C and/or 1301D that are located in one or more data centers, and/or located in varying countries on different continents).

A processor can include a microprocessor, microcontroller, processor module or subsystem, programmable integrated circuit, programmable gate array, or another control or computing device.

The storage media 1306 can be implemented as one or more computer-readable or machine-readable storage media. Note that while in the example embodiment of FIG. 13 storage media 1306 is depicted as within computer system 1301A, in some embodiments, storage media 1306 may be distributed within and/or across multiple internal and/or external enclosures of computing system 1301A and/or additional computing systems. Storage media 1306 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

It should be appreciated that computing system 1300 is only one example of a computing system, and that computing system 1300 may have more or fewer components than shown, may combine additional components not depicted in the example embodiment of FIG. 13, and/or computing system 1300 may have a different configuration or arrangement of the components depicted in FIG. 13. The various components shown in FIG. 13 may be implemented in hardware, software, or a combination of both hardware and software, including one or more signal processing and/or application specific integrated circuits.

Further, the steps in the processing methods described herein may be implemented by running one or more functional modules 1308 in information processing apparatus such as general purpose processors or application specific chips, such as ASICs, FPGAs, PLDs, or other appropriate devices. These modules, combinations of these modules, and/or their combination with general hardware are all included within the scope of protection of the invention.

Geologic interpretations, models and/or other interpretation aids may be refined in an iterative fashion; this concept is applicable to embodiments of the present methods discussed herein. This can include use of feedback loops executed on an algorithmic basis, such as at a computing device (e.g., computing system 1300, FIG. 13), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for direct arrival replacement, the method comprising:

sending, from a seismic source, a seismic signal;

receiving, via a seismic receiver, a direct arrival signal from the seismic source, wherein the direct arrival signal propagates only in a water layer;

creating intermediate data by attenuating the direct arrival signal or attenuating the direct arrival signal and one or more strong early arrival signals recorded at the seismic receiver;

transforming the intermediate data from a first processing domain into a second processing domain;

estimating a scalar for model calibration and a seabed reflectivity from an area around the direct arrival signal;

decomposing the direct arrival signal in the second processing domain into an upgoing wavefield component and a downgoing wavefield component;

modelling the direct arrival signal in the second processing domain using the scalar to produce a modelled direct arrival signal;

inserting the modelled direct arrival signal into the downgoing wavefield component in the second processing domain, wherein inserting the modelled direct arrival signal includes removing at least a portion of the direct arrival signal that is clipped or distorted, to produce corrected seismic data; and using the corrected seismic data to perform a seismic processing operation.

2. The method of claim 1, wherein the first processing domain comprises a space-time domain.

3. The method of claim 1, wherein the second processing domain comprises a Radon domain.

4. The method of claim 1, wherein the direct arrival signal is modeled using a calibrated marine source model or a finite difference model.

5. The method of claim 1, further comprising performing preprocessing of the direct arrival signal to reduce noise and/or clipping artifacts recorded by the seismic receiver.

6. The method of claim 5, wherein the preprocessing comprises performing a wavefield deconvolution of the direct arrival signal in a plane wave domain.

7. The method of claim 1, wherein inserting the modelled direct arrival signal includes replacing the portion of the direct arrival signal that is clipped or distorted with corresponding samples of the modelled direct arrival signal.

8. A system for direct arrival replacement, comprising:

a computer processor; and a memory storing instructions executed by the computer processor, wherein the instructions comprise a method comprising:

sending, from a seismic source, a seismic signal;

receiving, via a seismic receiver, a direct arrival signal from the seismic source, wherein the direct arrival signal propagates only in a water layer;

creating intermediate data by attenuating the direct arrival signal or attenuating the direct arrival signal and one or more strong early arrival signals recorded at the seismic receiver;

transforming the intermediate data from a first processing domain into a second processing domain;

estimating a scalar for model calibration and a seabed reflectivity from an area around the direct arrival signal;

decomposing the direct arrival signal in the second processing domain into an upgoing wavefield component and a downgoing wavefield component;

modelling the direct arrival signal in the second processing domain using the scalar to produce a modelled direct arrival signal;

inserting the modelled direct arrival signal into the downgoing wavefield component in the second processing domain, wherein inserting the modelled direct arrival signal includes removing at least a portion of the direct arrival signal that is clipped or distorted, to produce corrected seismic data; and using the corrected seismic data to perform a seismic processing operation.

9. The system of claim 8, wherein the first processing domain comprises a space-time domain.

10. The system of claim 8, wherein the second processing domain comprises a Radon domain.

11. The system of claim 8, wherein the direct arrival signal is modeled using a calibrated marine source model or a finite difference model.

12. The system of claim 8, further comprising performing preprocessing of the direct arrival signal to reduce noise and/or clipping artifacts recorded by the seismic receiver.

13. The system of claim 12, wherein the preprocessing comprises performing a wavefield deconvolution of the direct arrival signal in a plane wave domain.

14. A non-transitory computer readable medium storing instructions that are configured to, when executed, cause a computer processor to perform a method comprising:

sending, from a seismic source, a seismic signal;

receiving, via a seismic receiver, a direct arrival signal from the seismic source, wherein the direct arrival signal propagates only in a water layer;

creating intermediate data by attenuating the direct arrival signal or attenuating the direct arrival signal and one or more strong early arrival signals recorded at the seismic receiver;

transforming the intermediate data from a first processing domain into a second processing domain;

estimating a scalar for model calibration and a seabed reflectivity from an area around the direct arrival signal;

decomposing the direct arrival signal in the second processing domain into an upgoing wavefield component and a downgoing wavefield component;

modelling the direct arrival signal in the second processing domain using the scalar to produce a modelled direct arrival signal;

inserting the modelled direct arrival signal into the downgoing wavefield component in the second processing domain, wherein inserting the modelled direct arrival signal includes replacing at least a portion of the direct arrival signal that is clipped or distorted with corresponding samples of the modelled direct arrival signal, to produce corrected seismic data; and using the corrected seismic data to perform a seismic processing operation.

15. The non-transitory computer readable medium of claim 14, wherein the first processing domain comprises a space-time domain.

16. The non-transitory computer readable medium of claim 14, wherein the second processing domain comprises a Radon domain.

17. The non-transitory computer readable medium of claim 14, wherein the direct arrival signal is modeled using a calibrated marine source model or a finite difference model.

18. The non-transitory computer readable medium of claim 14, further comprising performing preprocessing of the direct arrival signal to reduce noise and/or clipping artifacts recorded by the seismic receiver.

19. The non-transitory computer readable medium of claim 18, wherein the preprocessing comprises performing a wavefield deconvolution of the direct arrival signal in a plane wave domain.

* * * * *